US008941158B2

(12) United States Patent
Iida et al.

(10) Patent No.: US 8,941,158 B2
(45) Date of Patent: Jan. 27, 2015

(54) SOLID-STATE IMAGING DEVICE

(75) Inventors: Yoshinori Iida, Tokyo (JP); Eishi Tsutsumi, Kawasaki (JP); Akira Fujimoto, Kawasaki (JP); Koji Asakawa, Kawasaki (JP); Hisayo Momose, Yokohama (JP); Koichi Kokubun, Yokohama (JP); Nobuyuki Momo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 452 days.

(21) Appl. No.: 12/875,809

(22) Filed: Sep. 3, 2010

(65) Prior Publication Data

US 2011/0220976 A1    Sep. 15, 2011

(30) Foreign Application Priority Data

Mar. 11, 2010   (JP) ................................ 2010-054032

(51) Int. Cl.
H01L 31/0216   (2014.01)
H01L 27/146    (2006.01)
(52) U.S. Cl.
CPC ........ H01L 27/1464 (2013.01); H01L 27/1462 (2013.01); H01L 27/1463 (2013.01)
USPC .................... 257/291; 257/292; 257/E31.121
(58) Field of Classification Search
USPC ................................................. 257/291, 292
See application file for complete search history.

(56) References Cited

U.S. PATENT DOCUMENTS 6,040,936 A * 3/2000 Kim et al. ...................... 359/245
7,223,960 B2 * 5/2007 Mouli ............................ 250/226
7,423,254 B2 * 9/2008 Arend et al. ................ 250/214.1
8,269,299 B2 * 9/2012 Yokogawa ..................... 257/432
2005/0184291 A1 * 8/2005 Cole et al. ........................ 257/59
2007/0091190 A1 * 4/2007 Iwabuchi et al. ............. 348/294
2008/0170143 A1 * 7/2008 Yoshida ........................ 348/294
2009/0079322 A1   3/2009 Tsutsumi et al.
2009/0134486 A1 * 5/2009 Fujikata ........................ 257/449
2009/0146198 A1 * 6/2009 Joe et al. ....................... 257/292

(Continued)

FOREIGN PATENT DOCUMENTS

JP    2006-509358    3/2006
JP    2009-38352     2/2009
WO    WO 2004/054001 A2   6/2004

OTHER PUBLICATIONS

Office Action issued Jan. 20, 2012, in Japanese Patent Application No. 2010-054032 with English translation.
U.S. Appl. No. 13/216,977, filed Aug. 24, 2011, Masunaga, et al.
U.S. Appl. No. 12/875,534, filed Sep. 3, 2010, Ueno, et al.

(Continued)

*Primary Examiner* — Benjamin Sandvik
(74) *Attorney, Agent, or Firm* — Oblon, Spivak, McClelland, Maier & Neustadt, L.L.P.

(57) ABSTRACT

Certain embodiments provide a solid-state imaging device including: a semiconductor substrate of a first conductivity type having a first face and a second face that is the opposite side from the first face; a plurality of pixels provided on the first face of the semiconductor substrate, each of the pixels including a semiconductor region of a second conductivity type that converts incident light into signal charges, and stores the signal charges; a readout circuit provided on the second face of the semiconductor substrate to read the signal charges stored in the pixels; an ultrafine metal structure placed at intervals on a face on a side of the semiconductor region, the light being incident on the face; and an insulating layer provided between the ultrafine metal structure and the semiconductor region.

6 Claims, 21 Drawing Sheets

(56) References Cited

U.S. PATENT DOCUMENTS

2009/0153708 A1* 6/2009 Hirota et al. .................. 348/294
2009/0211783 A1  8/2009 Tsutsumi et al.
2010/0013040 A1* 1/2010 Okamoto et al. ............. 257/432

OTHER PUBLICATIONS

U.S. Appl. No. 12/879,785, filed Sep. 10, 2010, Yamazaki et al.
William L. Barnes et al., "Surface plasmon subwavelength optics", Nature Publishing Group 2003, vol. 424, Aug. 14, 2003, pp. 824-830.

* cited by examiner

SOLID-STATE IMAGING DEVICE

CROSS-REFERENCE TO RELATED APPLICATION

This application is based upon and claims the benefit of priority from prior Japanese Patent Application No. 2010-54032 filed on Mar. 11, 2010 in Japan, the entire contents of which are incorporated herein by reference.

FIELD

Embodiments described herein relate to a solid-state imaging device.

BACKGROUND

In recent years, pixel sizes are rapidly becoming smaller, in response to demands for solid-state imaging elements that are smaller in size and include a larger number of pixels. Particularly, since there is a need to satisfy both the demands for smaller camera modules and a larger number of pixels, there are strong demands for pixel miniaturization in the imaging elements for portable telephone devices with camera functions. The pixel sizes are switching from 1.7 μm to 1.4 μm, and 1.1-μm pitch pixels are being developed.

However, as pixels become smaller, the tendency of the S/N ratio to be lower becomes inevitable. Particularly, since the absorption coefficient of single-crystal silicon with respect to visible light is low, the depth of each of the photodiodes for photoelectric conversions needs to be 3 μm or greater. In view of this, as the pixel sizes become smaller, an increase in aspect ratio of photodiodes in a pixel cross-section structure is inevitable. As a result, crosstalk noise due to obliquely incident light increases. Reducing the crosstalk noise is a critical issue in the trend toward pixel miniaturization. As described above, to prevent a decrease in the S/N ratio in pixel miniaturization, it is critical to reduce crosstalk noise.

When crosstalk noise is reduced, it is also critical to avoid an increase in photodiode noise. In decreasing photodiode noise in a solid-state imaging device, a so-called buried photodiode structure that has a high-density $p^+$-type impurity diffused region in the vicinity of the interface between Si and a $SiO_2$ layer is very effective to prevent the dark current generated in the interface state between Si and the $SiO_2$ layer from flowing into photodiodes. Such a buried photodiode structure is now a standard feature in solid-state imaging devices.

However, when a buried photodiode structure is formed, it is difficult to form a very thin high-density $p^+$-type impurity diffused region in the vicinity of the interface, and the thickness normally becomes 100 nm or greater.

To reduce crosstalk noise, on the other hand, photodiodes are effectively made thinner by increasing the light absorption efficiency in the photodiodes. This is because obliquely incident light can be prevented from entering adjacent pixels by reducing the invasion length of obliquely incident light.

It is known that forming strong electric fields localized by surface plasmon resonance is effective to reduce the thickness of each photodiode made of single-crystal silicon having a low light absorption coefficient.

However, the region in which strong electric fields are localized is located extremely close to the surface plasmon resonance structure, and is included in the high-density $p^+$-type impurity diffused region in the vicinity of the interface in the above described buried photodiode structure. The signal electrons photoelectrically converted in the high-density $p^+$-type impurity diffused region in the vicinity of the interface do not flow into the photodiodes, and therefore, are lost, without contributing to the sensitivity to light. As a result, an increase in the sensitivity is not achieved.

If the high-density $p^+$-type impurity diffused region is not formed in the vicinity of the interface for the sake of increasing the sensitivity, the current generated from the interface level between Si and the $SiO_2$ layer flow into the photodiodes, though the sensitivity becomes higher. In such a case, the noise increases, and the S/N ratio becomes poorer. As a result, high-sensitivity characteristics cannot be achieved.

DETAILED DESCRIPTION

Hereafter, solid-state imaging devices according to embodiments will be described more specifically with reference to the drawings.

Certain embodiments provide a solid-state imaging device including: a semiconductor substrate of a first conductivity type having a first face and a second face that is the opposite side from the first face; a plurality of pixels provided on the first face of the semiconductor substrate, each of the pixels including a semiconductor region of a second conductivity type that converts incident light into signal charges, and stores the signal charges; a readout circuit provided on the second face of the semiconductor substrate to read the signal charges stored in the pixels; an ultrafine metal structure placed at intervals on a face on a side of the semiconductor region, the light being incident on the face; and an insulating layer provided between the ultrafine metal structure and the semiconductor region.

First Embodiment

Figure 1:
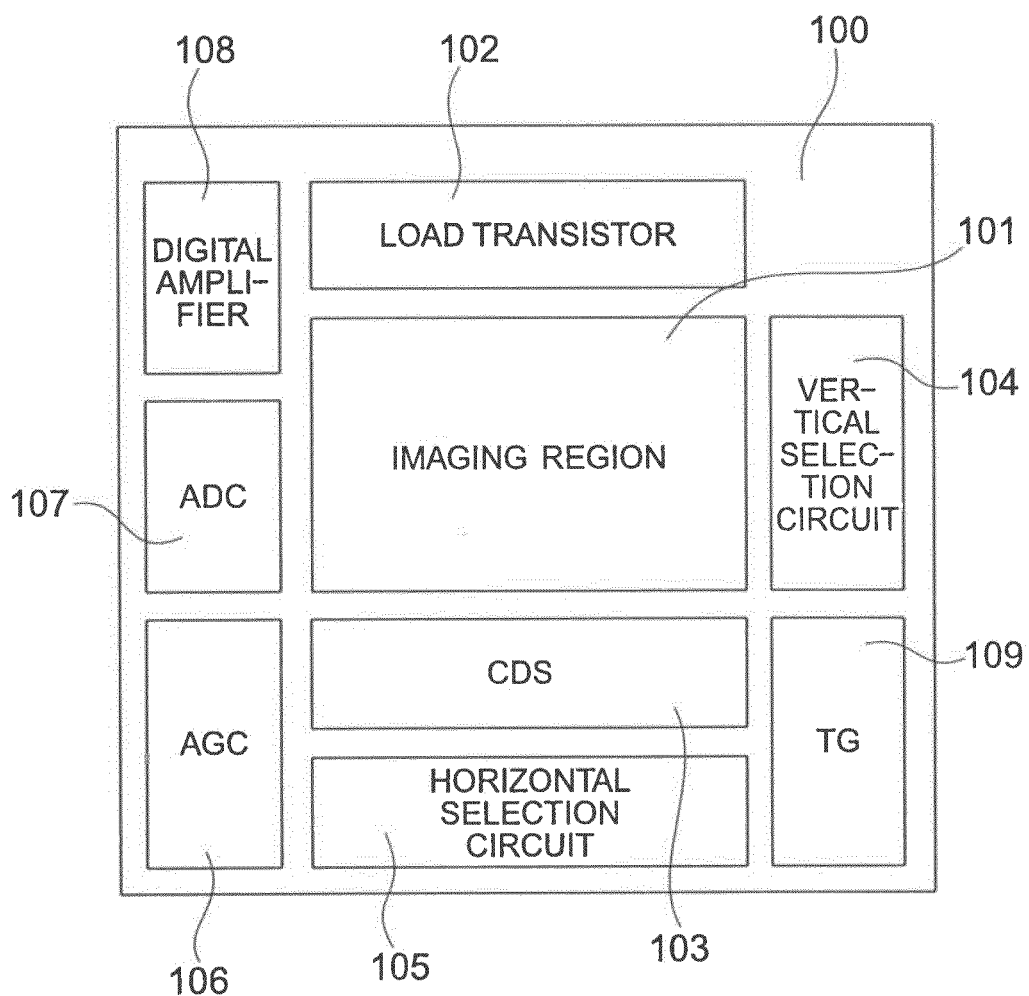
FIG. 1 is a plan view of a solid-state imaging device according to a first embodiment.

FIG. 1 shows a solid-state imaging device according to a first embodiment. The solid-state imaging device 100 according to this embodiment includes photoelectric conversion pixels 200 that are arranged in a matrix fashion in an imaging region 101. The photoelectric conversion pixels 200 convert incident light signals into electrical signals through photoelectric conversions. A load transistor unit 102, a CDS (Correlated Double Sampling) circuit unit 103, a V (vertical) selection circuit 104, a H (Horizontal) selection circuit 105, an AGC (automatic gain control) circuit 106, an ADC (A-D converter) 107, a digital amplifier 108, a TG (timing generator) circuit 109, and the likes are provided to surround the imaging region 101. The ADC 107 is integrally formed with the CDS circuit 103, and can be formed as a column-type CDS-ADC circuit structure. Alternatively, the TG circuit 109, the AGC circuit 106, the ADC 107, the digital amplifier 108, and the likes may be formed on a separate chip.

Figure 2:
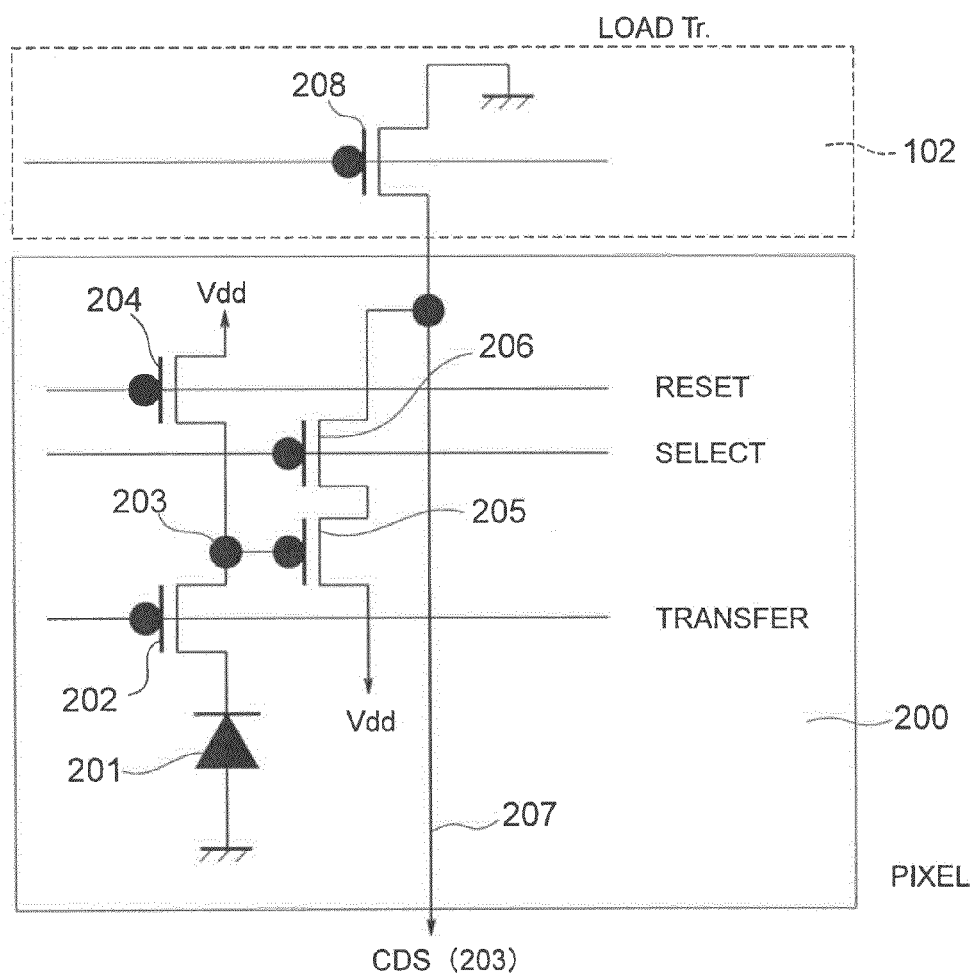
FIG. 2 is a circuit diagram of one of the pixels of the solid-state imaging device according to the first embodiment.

FIG. 2 shows the inner circuit structure of one of the pixels 200 forming the imaging region 101. In FIG. 2, the portion surrounded by a solid line on the lower side is the circuit structure of the pixel 200. A photodiode that performs photoelectric conversions is connected to a floating diffusion layer 203 via a transfer transistor 202. The floating diffusion layer 203 is formed with a high-density n$^+$-type impurity diffused region, for example, and is connected to Vdd via a reset transistor 204 that resets the floating diffusion layer 203. The floating diffusion layer 203 is connected to the gate of an amplifier transistor 205. The drain of the amplifier transistor 205 is connected to a drive voltage Vdd, and the source of the amplifier transistor 205 is connected to a vertical signal line 207 via a select transistor 206. One end of the vertical signal line 207 is connected to the ground via a load transistor 208 that is surrounded by a broken line in the upper portion of FIG. 2 and is located outside the imaging region 101, and the other end of the vertical signal line 207 is connected to the CDS circuit 103 (see FIG. 1) located outside the imaging region 101. The load transistor 208 and the amplifier transistor 205 that are connected in series via the vertical signal line 207 constitute a source-follower circuit, and output a signal voltage generated in the floating diffusion layer 203 to the CDS circuit 103.

In FIG. 2, the unit pixel 200 has all the functions for photoelectric conversions, signal charge storage, charge-voltage conversions, and formation of the source-follower circuit. However, two or more photodiodes 201 and transfer transistors 202 may be connected to a single floating diffusion layer 203 as needed, so as to share the other components forming the circuit in the pixel, such as the floating diffusion layer 203, the reset transistor 204, the amplifier transistor 205, and the select transistor 206. In other words, miniaturization of the pixels 200 can be more easily realized by forming two pixels with one cell, or forming four pixels with one cell. In the structure shown in FIG. 2, the positions of the amplifier transistor 205 and the select transistor 206 may be switched.

Figure 3:
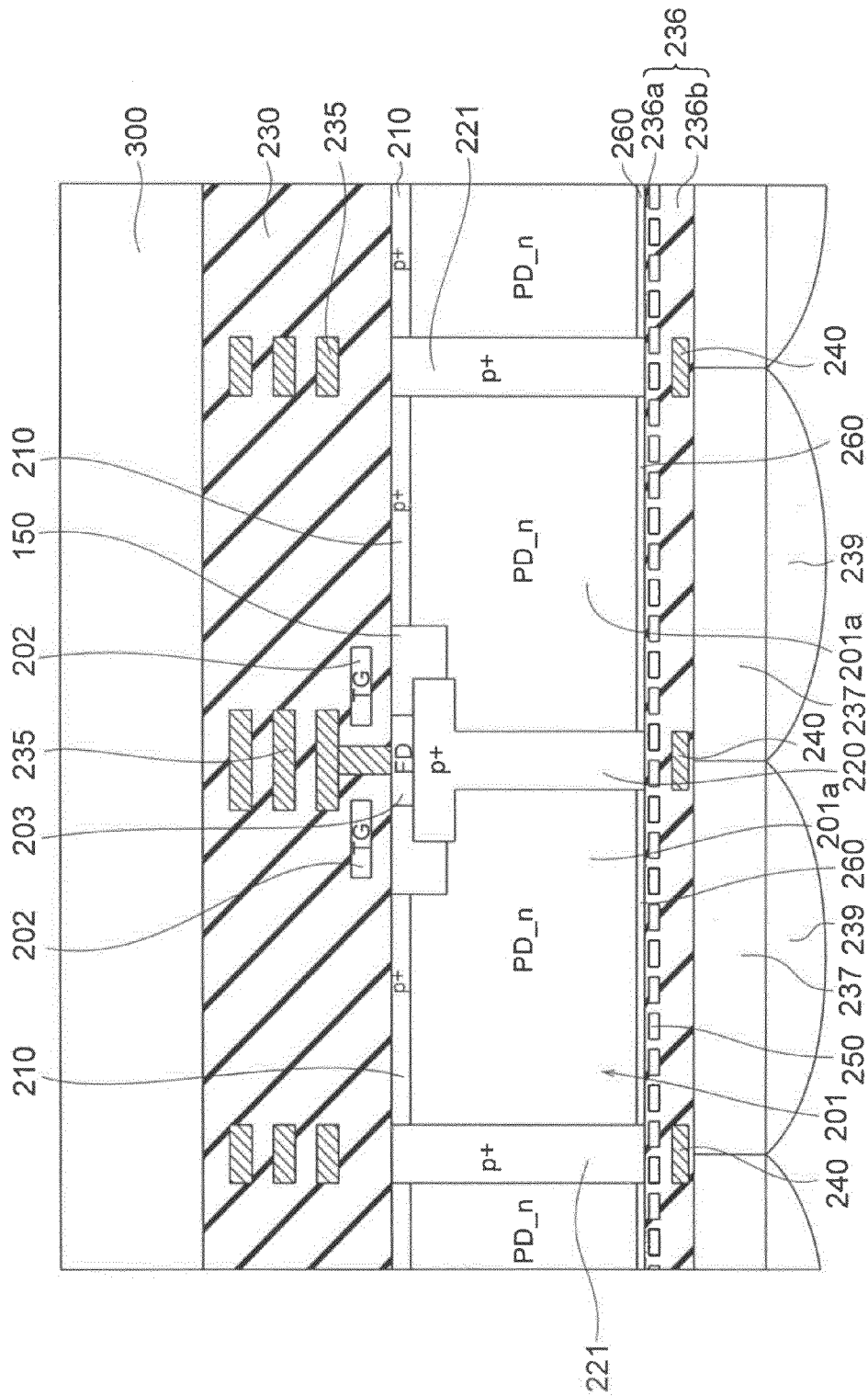
FIG. 3 is a cross-sectional view of the solid-state imaging device according to the first embodiment.

FIG. 3 shows a cross-section structure of the solid-state imaging device according to the first embodiment. The solid-state imaging device of this embodiment is a solid-state imaging device of a back-illuminated type. Ultrafine metal structures 250 that have free electrons resonant with the electric field components of light and function as metal structures each having a 1-μm or smaller minute structure are placed in an insulating layer 236 between PD_n-regions 201a as the n-type impurity diffused regions constituting the photodiodes 201, and color filters 237. The ultrafine metal structures 250 each have a nanometer size structure (20 to 200 nm, for example), and are arranged at intervals in a mesh-like fashion.

In this solid-state imaging device of the first embodiment, n-type impurity diffused regions (hereinafter also referred to as the PD_n-regions) constituting the photodiodes 201 are formed inside a p-type silicon substrate (a semiconductor substrate) 150. Signal electrons that are generated through photoelectric conversions in the photodiodes 201 (see FIG. 2) having pn junctions formed with the PD_n-regions 201a and the p-type semiconductor substrate 150 are stored in the PD_n-regions 201a. The transfer transistors 202 formed on the surface of the silicon substrate 150 are turned on, to transfer the signal electrons to the floating diffusion layer 203 formed under the surface of the silicon substrate 150. The amplifier transistor 205 (see FIG. 2) having its gate electrically connected to the floating diffusion layer 203 is modulated to read the signals in accordance with the amount of incident light. A readout circuit is formed with the transfer transistors 202, the floating diffusion layer 203, the reset transistor 204, the amplifier transistor 205, the select transistor 206, and the likes.

In this embodiment, each floating diffusion layer 203 is shared between adjacent pixels (two in this embodiment). The transfer transistors 202 and the amplifier transistors 205 are covered with an interlayer insulating layer 230, and metal wirings 235 connected to those transistors or the floating diffusion layers 203 are provided in the interlayer insulating layer 230. A supporting substrate 300 is provided on the interlayer insulating layer 230.

Each PD_n-region 201a is a so-called buried photodiode structure that is completely buried inside the silicon substrate 150 to lower noise, and high-density p$^+$-type impurity diffused regions 220 and 221 are provided as the pixel separation structures for separating devices from adjacent pixels. Each p$^+$-type impurity diffused region 220 is provided to extend from the lower face of the corresponding floating diffusion layer 203 to the back face of the p-type silicon substrate 150. Each p$^+$-type impurity diffused region 221 is provided to penetrate through the p-type silicon substrate 150 from the front face to the back face between adjacent pixels that do not share a floating diffusion layer 203. A p$^+$-region 210 is provided on each portion of the semiconductor substrate 150 between a PD_n-type region 201a and the interlayer insulating layer 230, so as to prevent dark current from flowing into the PD_n-region 201a. A constant potential (0 V, for example) is applied to this p$^+$-region 210.

Since there are adjacent pixels that share the floating diffusion layers 203 in this embodiment, a pixel-circuit sharing method can be implemented. Specifically, in the pixel layout of the solid-state imaging device according to this embodiment, the two photodiodes sharing one floating diffusion layer 203 are formed by arranging a photodiode 201, a transfer transistor 202, a floating diffusion layer 203, a transfer transistor 202, and a photodiode 201 in this order on the surface of the silicon substrate 150 on the wiring side. Inside the silicon substrate 150, however, a photodiode 201, a p$^+$-pixel separation region 220, and a photodiode 201 are formed and arranged in this order.

The insulating layer 236 made of SiO$_2$, for example, is provided on the back face side of the silicon substrate 150, and the ultrafine metal structures 250 that are arranged at intervals in a mesh-like fashion in the imaging region 101 are provided in the insulating layer 236. The insulating layer 236 includes an insulating layer 236a provided between the PD_n-regions 201a as n-type impurity diffused regions and the ultrafine metal structures 250, and an insulating layer 236b that covers the ultrafine metal structures 250. Those ultrafine metal structures 250 are provided in the insulating layer 236, so as to be closer to the p-type silicon substrate 150. Light shields 240 are also provided in the insulating layer 236 (or 236b) so as to overlap with the p$^+$-type impurity diffused regions 220 and 221. Color filters 237 are provided on the face on the opposite side of the insulating layer 236 from the silicon substrate 150. The color filters 237 correspond to the respective PD_n-regions 201a. Microlenses 239 are provided on the faces on the opposite sides of the respective color filters 237 from the insulating layer 236.

Figure 4:
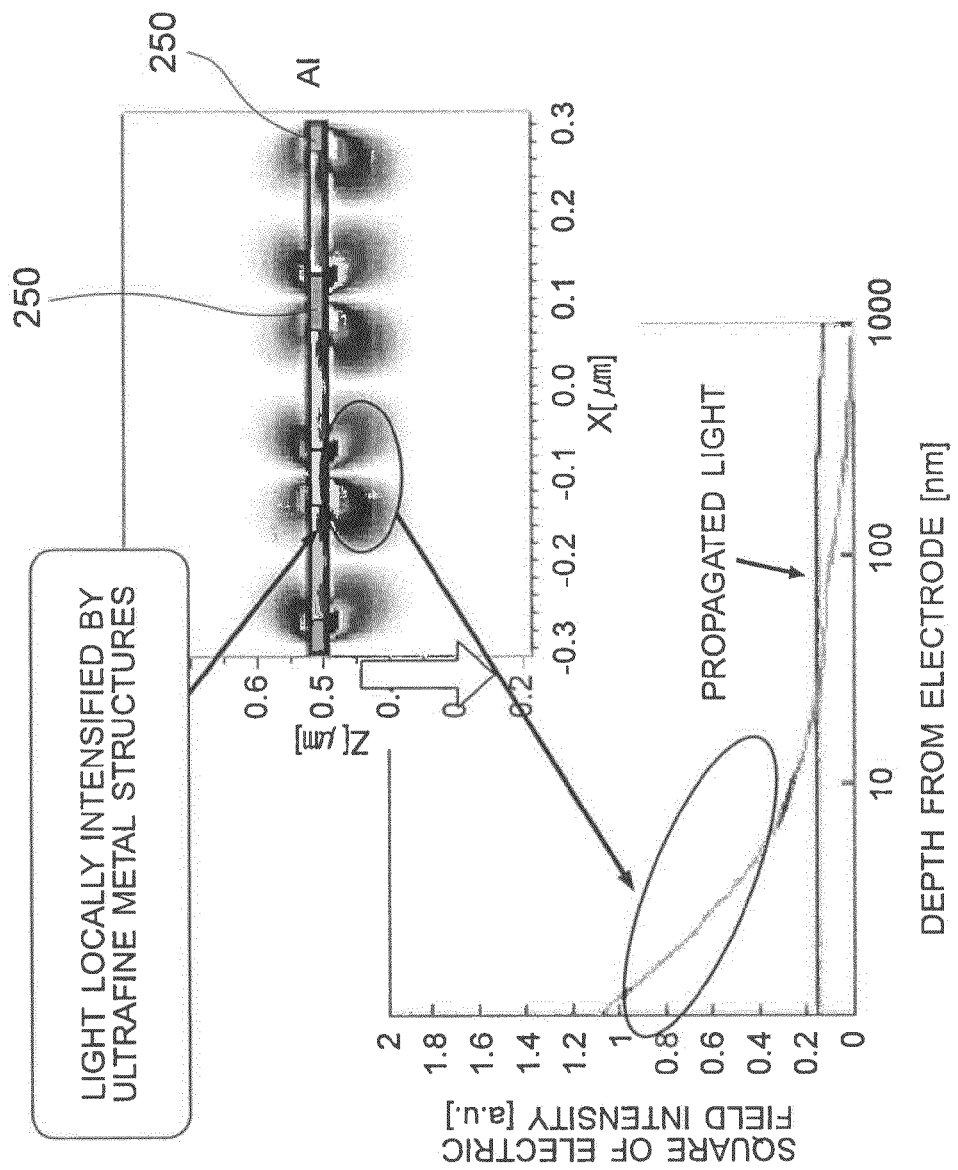
FIG. 4 is a diagram for explaining the localizing of a strong electric field region by ultrafine metal structures.

In a case where the ultrafine metal structures 250 are arranged at intervals in a mesh-like fashion as in this embodiment, when light is emitted onto the ultrafine metal structures 250, the free electrons on the surfaces of the ultrafine metal structures 250 collectively oscillate due to electric fields of the light, and are put into a polarized state on the surfaces of the ultrafine metal structures 250, as shown in FIG. 4. Since movement of electrons is limited at the end portions of the minute metals, the collective oscillation of the free electrons results in a pool of electrons. The density of the free electrons at the end portions of the ultrafine metal structures 250 become extremely high, and very strong electric fields are generated. As a result, the electric fields are remarkably amplified in the vicinities of the surfaces of the ultrafine metal structures 250. The movement of the electric fields of the ultrafine metal structures 250 causes strong "intensified electric fields" in the vicinities of the ultrafine metal structures 250 according to the Maxwell's formula. The electric fields are locally intensified in the propagation direction (toward the PD_n-regions 201a in this embodiment). The intensity of the intensified light (the strengths of the electric fields) is higher than the intensity of the propagated light observed where the ultrafine metal structures 250 are not provided, at a shorter distance from the ultrafine metal structures 250 (or at a shallower spot). The intensity of the intensified light becomes remarkably lower at a spot that is deeper and farther away from the ultrafine metal structures 250. Since the strong electric fields localized by surface plasmon resonance do not propagate into the silicon (the PD_n-regions 201a), obliquely incident light does not enter the adjacent pixels. As a result, crosstalk noise can be greatly reduced. In FIG. 4, Al is used as the material of the ultrafine metal structures 250. Other than Al, Au or Ag may be used as the material of the ultrafine metal structures 250, to achieve the same effects as above. This is the common phenomenon observed when electromagnetic wave is emitted on an ultrafine metal structure made of a metal at a frequency below the plasma frequency, regardless of whether the electromagnetic wave is ultraviolet, visible, infrared, or microwave. Therefore, almost all the metals may be used as ultrafine metal structures in any one of embodiments, as long as the metals have frequencies equal to or lower than the plasma frequency.

If the metal portions of the ultrafine metal structures of this embodiment are continuous portions, electric conduction is secured, and accordingly, the metal portions can be used as electrodes. The conductive properties observed at this point characteristically do not exhibit a high resistance value, since the metal portions are made of a general metal. For example, where Al is used to form the ultrafine metal structures that have continuous metal portions according to an embodiment of the present invention, the resistivity is characteristically 1/10 to 1/100 of that of a general ITO.

Even where the metal portions of ultrafine metal structures according to an embodiment of the present invention are not continuous portions, strong electric fields are generated due to the above mentioned principle of "intensified electric fields". Accordingly, the effects of the present invention can be achieved.

Figure 5:
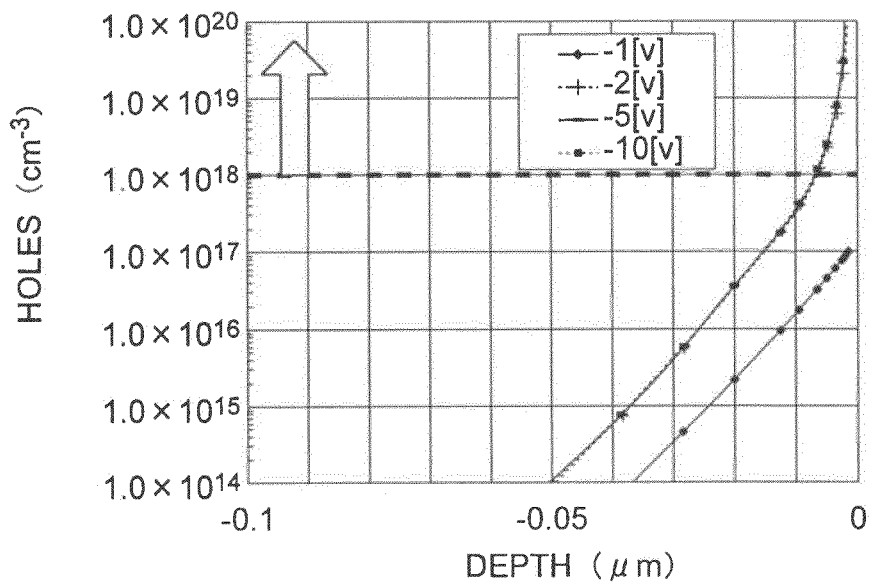
FIG. 5 is a graph showing distributions of the hole density in the vicinity of the interface between silicon and an insulating layer.
Figure 6:
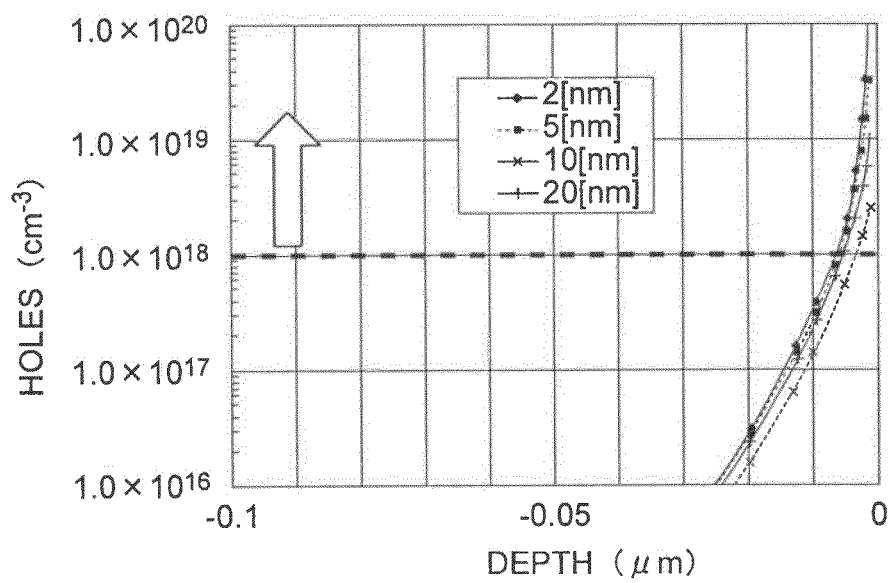
FIG. 6 is a graph showing distributions of the hole density in the vicinity of the interface between silicon and the insulating layer.

In this embodiment, by applying a negative voltage to the ultrafine metal structures 250, hole induced regions 260 are formed in the vicinities of the interfaces between the Si of the PD_n-regions 201a and the SiO$_2$ layer 236, as shown in FIG. 3. By virtue of the formation of the hole induced regions 260, the current generated in the interface state between the Si and the SiO$_2$ layer 236 can be prevented from flowing into the PD_n-regions 201a, and low dark current properties can be maintained. At this point, it is essential that the negative bias voltage is optimized by adjusting the material and thickness of the insulating layer. However, to achieve the low dark current properties, the hole volume density in the hole induced regions 260 in the vicinities of the interfaces should be adjusted to $1 \times 10^{18}$ cm$^{-3}$ or higher. FIGS. 5 and 6 show the results of simulations performed on the layer thickness of the SiO$_2$ layer and the conditions for the negative bias voltage to realize the low dark current properties.

FIG. 5 is a graph showing the relationship between the density (cm$^{-3}$) of holes induced in the PD_n-regions 201a in the vicinities of the interfaces with the SiO$_2$ layer and the depth from the interfaces with the SiO$_2$ layer observed where the layer thickness of the SiO$_2$ layer between the ultrafine metal structures 250 and the PD_n-regions 201a is 2 nm, and $-1$ V, $-2$ V, $-5$ V, and $-10$ V are applied as the negative voltage to the ultrafine metal structures 250. As can be seen from FIG. 5, when $-2$ V, $-5$ V, and $-10$V are applied as the negative voltage, substantially the same characteristics are observed. In view of this, where the layer thickness of the SiO$_2$ layer between the ultrafine metal structures 250 and the PD_n- regions 201a is 2 nm, the negative voltage to be applied to the ultrafine metal structures 250 should be −2 to −10 V.

FIG. 6 is a graph showing the relationship between the density ($cm^{-3}$) of holes induced in the PD_n-regions 201a in the vicinities of the interfaces with the $SiO_2$ layer and the depth from the interfaces with the $SiO_2$ layer observed where −2 V is applied as the negative voltage to the ultrafine metal structures 250, and the layer thickness of the $SiO_2$ layer between the ultrafine metal structures 250 and the PD_n-regions 201a is varied from 2 nm to 5 nm to 10 nm to 20 nm. As can be seen from FIG. 6, when −2 V is applied as the negative voltage to the ultrafine metal structures 250, the layer thickness of the $SiO_2$ layer should be 2 to 10 nm.

In a conventional solid-state imaging device that does not have ultrafine metal structures, it is not possible to realize PD_n-regions of a thickness of 5 μm or greater, which is a thickness necessary for achieving sufficiently high photoelectric conversion efficiency for red light that has the longer wavelengths in the visible light. Therefore, the sensitivity to red light cannot be made sufficiently higher. In the solid-state imaging device of this embodiment, on the other hand, strong electric fields are localized in the vicinities of the surface, by virtue of surface plasmon resonance of incident light. Since photoelectric conversions are performed in the field localized regions, a sufficiently high photoelectric conversion efficiency can be achieved in the PD_n-regions made of single-crystal silicon that has a low absorption coefficient with respect to red light. Accordingly, high-sensitivity characteristics can be obtained even in thin PD_n-regions.

In a conventional solid-state imaging device having a regular low dark current structure, high-density $p^+$-type impurity diffused regions are provided in the interfaces between the PD_n-regions and the $SiO_2$ layer. Since the depth of each of the $p^+$-type impurity diffused regions is 0.1 μm or greater, most of the blue light with a high absorption coefficient is absorbed in the $p^+$-type impurity diffused regions, and the sensitivity to blue light becomes poorer. In this embodiment, however, the depth of each hole induced region 260 formed in the vicinities of the interfaces can be adjusted to as small as 10 nm or less. Accordingly, the strong electric field energy locally intensified by the ultrafine metal structures can be effectively absorbed, and the sensitivity to blue light can also be made higher.

As described above, according to this embodiment, crosstalk noise can be greatly reduced, while the low dark current characteristics of photodiodes are maintained. Further, the sensitivity to blue light and the sensitivity to red light can also be made higher. Accordingly, a high-sensitivity solid-state imaging device with a high S/N ratio can be realized.

Furthermore, even if the PD_n-regions are made shallower, high-sensitivity characteristics can be realized. In conventional arts, to maintain light absorption properties, miniaturization in the depth direction of the substrate cannot be performed, and the scaling in pixel miniaturization is anisotropic. In this embodiment, on the other hand, isotropic scaling can be performed. Accordingly, there is less need to form deep PD_n-regions or perform deep device separations as specifically required in designing and processing of solid-state imaging devices. Thus, it is possible to remarkably reduce the difficulties in device development. Also, the device development period can be shortened, and the device development costs can be lowered.

Referring now to FIGS. 7(a) through 9, the wavelength dependencies with respect to the electric field intensities (near-field intensities) observed in cases where an insulating layer exists between the silicon substrate and the ultrafine metal structures as in this embodiment are described. This insulating layer is a $SiO_2$ layer or has a stack structure of a $SiO_2$ layer and a $HfO_2$ layer.

First, as shown in FIG. 7(a), samples are prepared by forming 2-nm and 4-nm thick $SiO_2$ layers on silicon substrates, and forming ultrafine metal structures using Al as the electrode material on the respective $SiO_2$ layers. Also, another sample is prepared by forming ultrafine metal structures made of Al directly on a silicon substrate, without a $SiO_2$ layer formed on the silicon substrate. Those ultrafine metal structures are arranged in a square lattice fashion at intervals (pitch) of 160 nm. The electrode gap opening width is 80 nm (½ of each interval), and the thickness of each of those ultrafine metal structures is 30 nm. Here, the electrode gap opening width indicates the length of the longest side if the planar shape of each electrode gap opening is a triangle, indicates the length of the longest diagonal line if the planar shape of each electrode gap opening is a polygonal shape, and indicates the length of the long axis if the planar shape of each electrode gap opening is an elliptical shape. FIG. 7(b) shows the wavelength dependencies (the spectra by plasmon resonance) with respect to the electric field intensities observed in cases where light is emitted onto those sample ultrafine metal structures. As can be seen from FIG. 7(b), the wavelength (the peak position) at which the electric field intensity becomes highest is approximately 720 nm in a case where the $SiO_2$ layer is not formed. When the $SiO_2$ layer of 2 nm or 4 nm in layer thickness is formed, the peak position shifts toward the short wavelength side by 100 nm. In the case where the $SiO_2$ layer of 4 nm in layer thickness is formed, the electric field intensity at the peak position is half or less of the electric field intensity at the peak position observed in the case where the $SiO_2$ layer of 2 nm in layer thickness is formed. The reason that the electric field intensity at the peak position where the $SiO_2$ layer is not formed is lower than the electric field intensity at the peak position in any other cases is that bulk absorption of Al occurs in the wavelength range in the neighborhood of 720 nm. Therefore, the layer thickness of a single-layer $SiO_2$ layer formed between a silicon substrate and ultrafine metal structures as in this embodiment should preferably be 2 nm of smaller.

Figure 7:
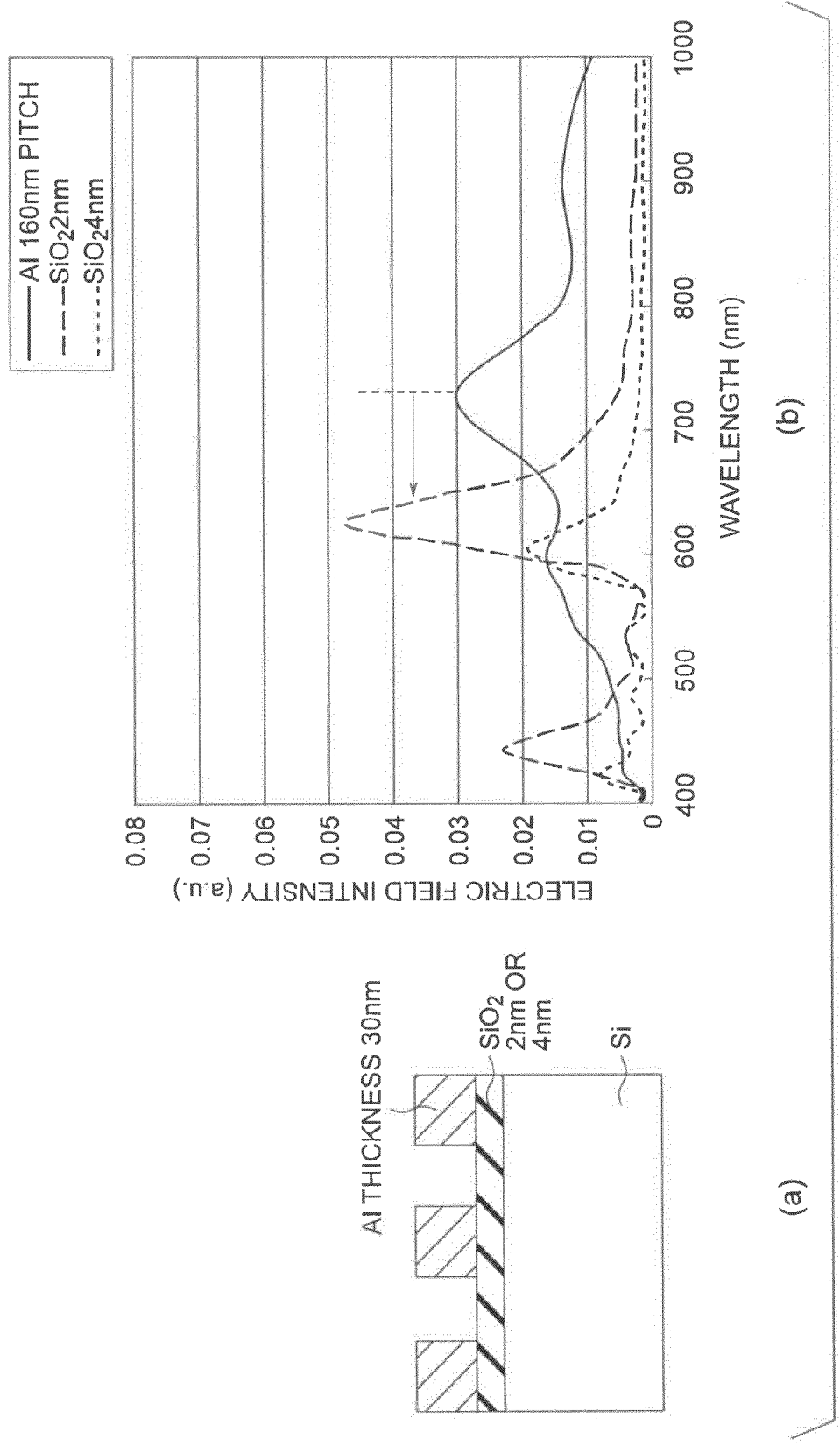
FIGS. 7(a) and 7(b) show the spectra with respect to the near-field intensities observed in a case where the thickness of a $SiO_2$ layer provided between the ultrafine metal structures and silicon is varied.
Figure 8:
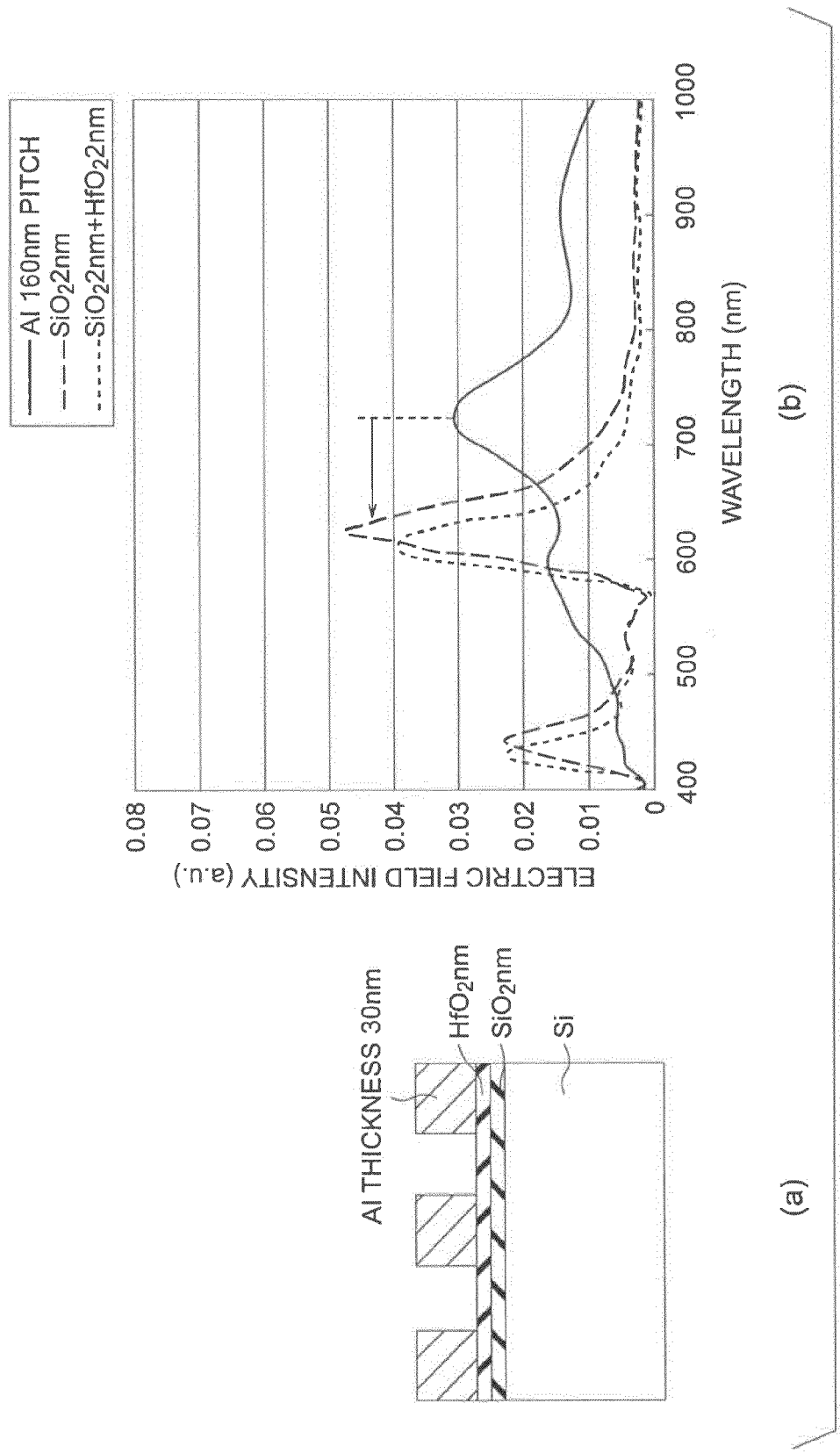
FIGS. 8(a) and 8(b) show the spectra of the near-field intensities observed in a case where a stack structure of a $SiO_2$ layer and a $HfO_2$ layer is used between the ultrafine metal structures and silicon.

Next, as shown in FIG. 8(a), a sample is prepared by forming a $SiO_2$ layer of 2 nm in layer thickness on a silicon substrate, forming a $HfO_2$ layer of 2 nm in layer thickness on the $SiO_2$ layer, and forming ultrafine metal structures using Al as the electrode material on the $HfO_2$ layer. Also, a sample is prepared by forming ultrafine metal structures made of Al directly on a silicon substrate, without a $SiO_2$ layer formed on the silicon substrate. Further, a sample is prepared by forming a $SiO_2$ layer of 2 nm in layer thickness on a silicon substrate and forming ultrafine metal structures made of Al on the $SiO_2$ layer. Those ultrafine metal structures are arranged in a square lattice fashion at intervals of 160 nm. The electrode gap opening width is 80 nm (½ of each interval), and the thickness of each of the ultrafine metal structures is 30 nm. FIG. 8(b) shows the wavelength dependencies with respect to the electric field intensities observed in cases where light is emitted onto those sample ultrafine metal structures. As can be seen from FIG. 8(b), when a stack structure of the $SiO_2$ layer of 2 nm in layer thickness and the $HfO_2$ layer of 2 nm in layer thickness is formed, the peak position shifts toward the short wavelength side by approximately 100 nm, as opposed to a case where a $SiO_2$ layer is not formed. In the case where the stack structure of the $SiO_2$ layer of 2 nm in layer thickness and the $HfO_2$ layer of 2 nm in layer thickness is formed, the electric field intensity at the peak position becomes only slightly lower than the electric field intensity at the peak position observed in the case where the SiO$_2$ layer of 2 nm in layer thickness is formed. It becomes obvious from the above fact that a decrease in electric field intensity at the peak position can be more effectively reduced by forming an insulating layer of a high dielectric constant material on the SiO$_2$ layer, compared with the case where a thick SiO$_2$ layer is formed as shown in FIG. 7. Therefore, when a thick SiO$_2$ layer is formed between a silicon substrate and ultrafine metal structures, it is preferable to form a high dielectric constant layer on the SiO$_2$ layer as in this embodiment. Also, in a case where a stack structure of a HfO$_2$ layer and a SiO$_2$ layer of a later described embodiment is provided as an insulating layer, it can be said that a sufficient electric field intensity can be maintained.

Figure 9:
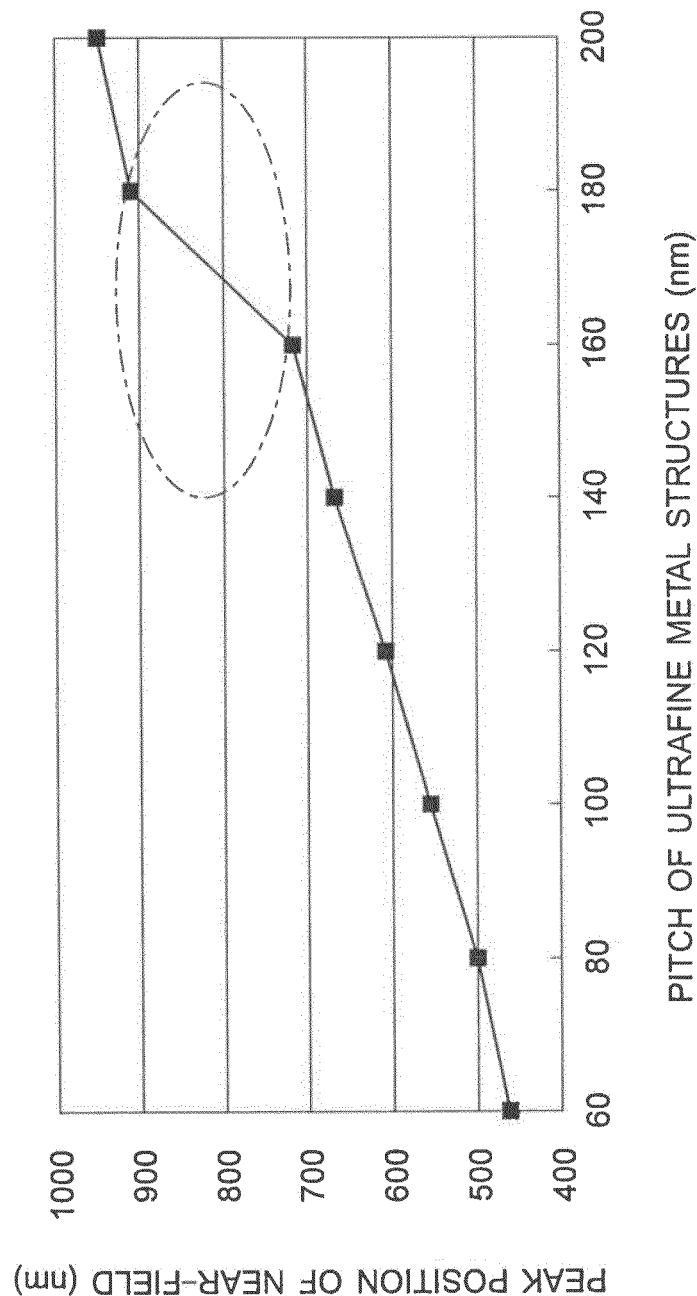
FIG. 9 is a graph showing the relationship between the ultrafine metal structures and the peak wavelength of a near-field spectrum.

FIG. 9 shows the variation of the peak position observed in a case where the pitch (the intervals) in the ultrafine metal structures is varied in the range of 60 to 200 nm. Here, the electrode gap opening width of the ultrafine metal structures is half the pitch of the ultrafine metal structures, and the thickness of each of the ultrafine metal structures is 30 nm. As can be seen from FIG. 9, the peak position is substantially proportional to the pitch of the ultrafine metal structures. In the range of 700 to 900 nm in wavelength (the range indicated by the dot-and-dash line in FIG. 9), however, bulk absorption of Al occurs, and as a result, the apparent dielectric constant of the ultrafine metal structures greatly changes. Therefore, the characteristics of the ultrafine metal structures observed where the pitch of the ultrafine metal structures is larger than 160 nm but smaller than 180 nm differs from those observed where the pitch of the ultrafine metal structures is outside that range. This phenomenon is unique to Al, and, when the same structures are made of Ag or the like, this absorption cannot be seen.

Figure 10:
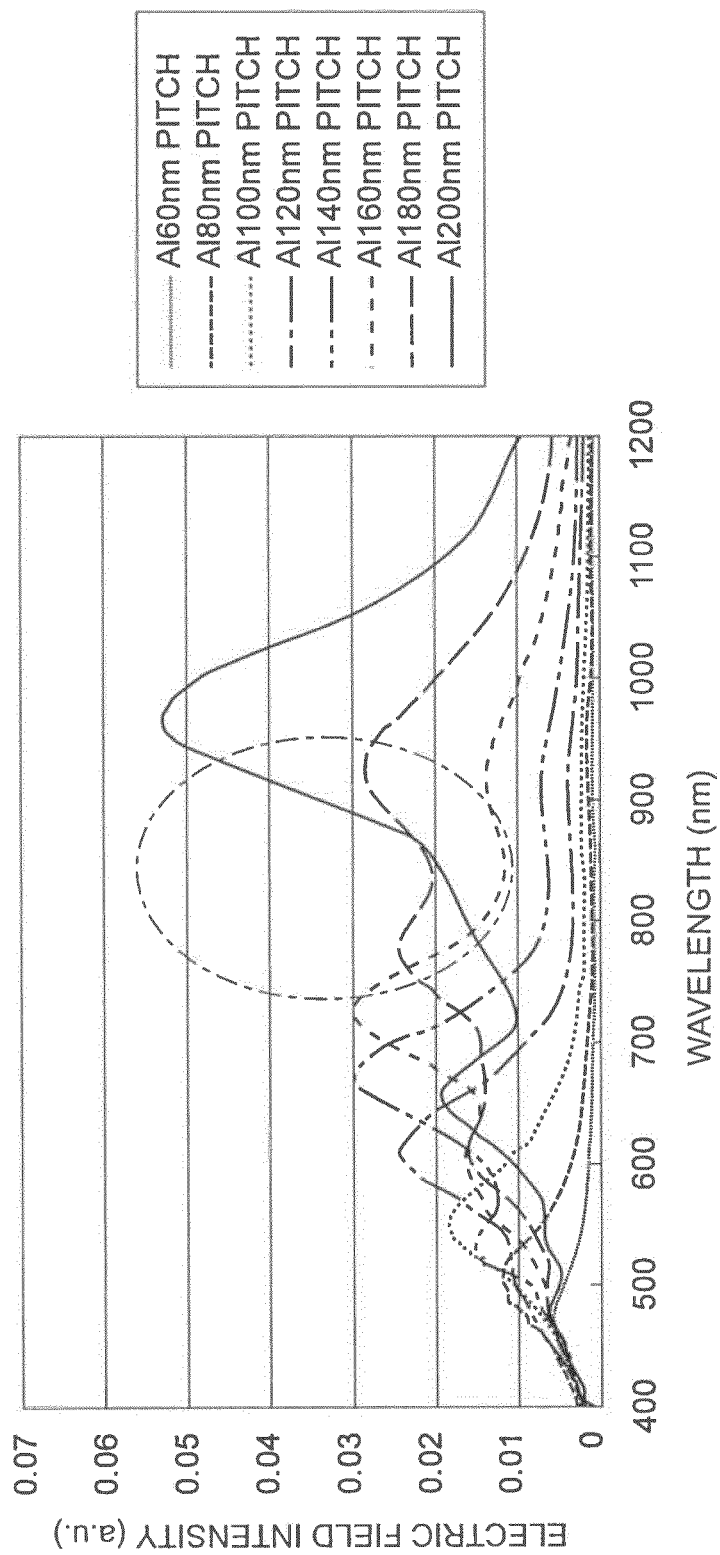
FIG. 10 shows the spectra of near-field intensities observed in a case where the pitch of the ultrafine metal structures is varied.

FIG. 10 shows the wavelength dependencies (the spectra by plasmon resonance) with respect to the electric field intensities observed in a case where the pitch (the intervals) in the ultrafine metal structures is varied in the range of 60 to 200 nm. Here, the gap opening width of the ultrafine metal structures is half the pitch of the gap openings, and the thickness of each of the ultrafine metal structures is 30 nm. As can be seen from FIG. 10, the intensity of the electric field (near-field) at the peak position becomes lower, as the pitch of the ultrafine metal structures becomes smaller, except for the wavelength range having bulk absorption of Al (the range indicated by the dot-and-dash line in FIG. 10). However, as long as the pitch of the ultrafine metal structures is within the range of 60 to 160 nm, plasmon resonance can be utilized in the visible region or a region where the wavelength is 400 to 700 nm. In a case where the ultrafine metal structures are made of Au or Ag, instead of Al, plasmon resonance can also be utilized in the visible region.

Figure 11:
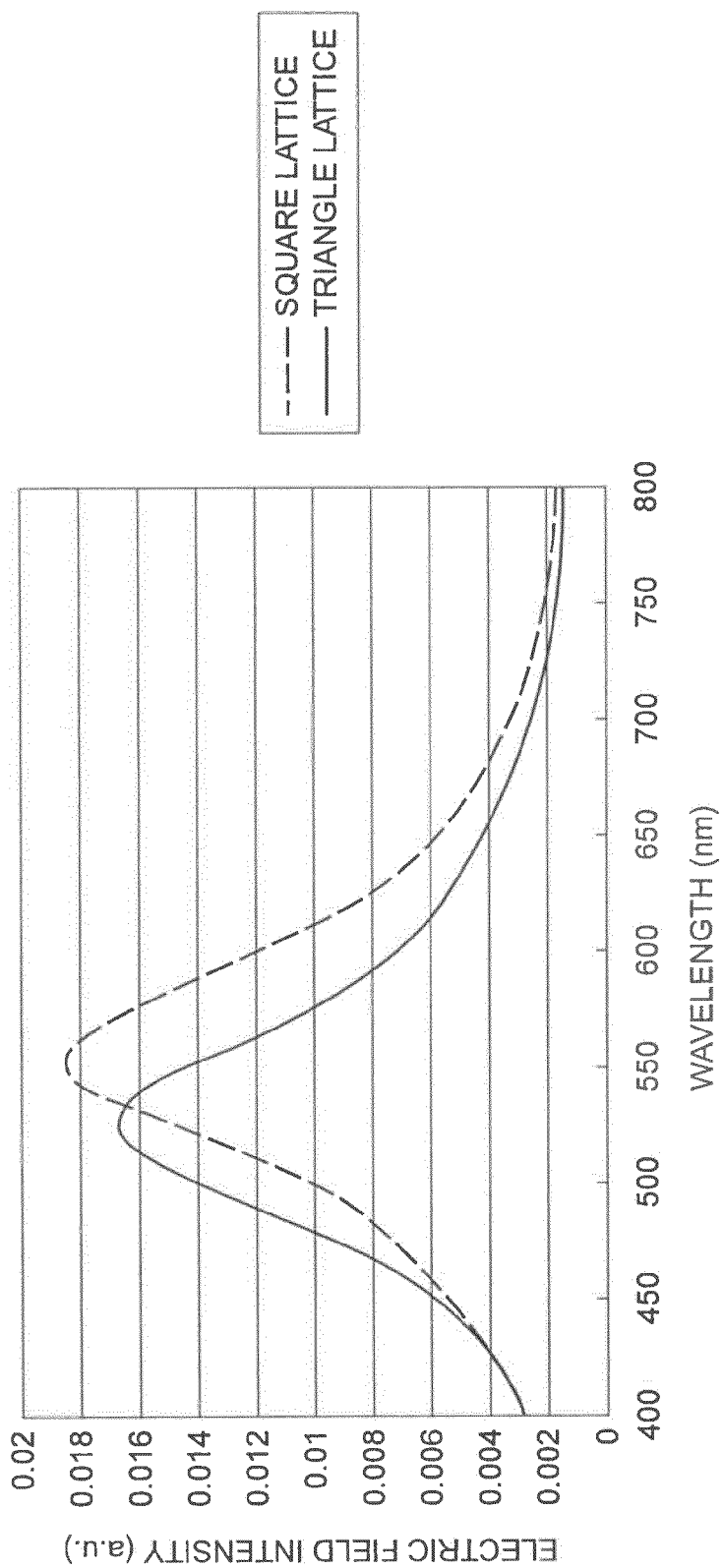
FIG. 11 shows the spectra of near-field intensities observed in cases where the ultrafine metal structures are arranged in a square lattice fashion or a triangle lattice fashion.

FIG. 11 shows the wavelength dependencies (the spectra by plasmon resonance) with respect to the electric field intensities observed in a case where ultrafine metal structures are arranged in a square lattice fashion and in a case where ultrafine metal structures are arranged in a triangle lattice fashion. Those ultrafine metal structures are made of Al, and have the pitch of 100 nm. The electrode gap opening width is half (50 nm) the pitch, and the thickness of each of the ultrafine metal structures is 30 nm. As can be seen from FIG. 11, the peak position observed in the case of the square lattice arrangement is slightly higher than the peak position observed in the case of the triangle lattice arrangement. The intensity at the peak position observed in the case of the square lattice arrangement is also higher than that observed in the case of the triangle lattice arrangement. Accordingly, it becomes apparent that a desired spectrum can be obtained by optimizing the electrode pitch and the electrode gap opening width in each of the cases.

In a case where three panel color elements or three solid-state imaging elements (the portions formed in the imaging region of a solid-state imaging device) are used for the three primary colors of red (R), green (G), and blue (B), ultrafine metal structures having an optimum material and an optimum pitch for a desired light wavelength should be formed. Likewise, in a solid-state imaging device that captures images of the near-infrared region of 0.7 to 1.1 μm, ultrafine metal structures having an optimum material and an optimum pitch for a desired light wavelength should be formed.

Figure 12:
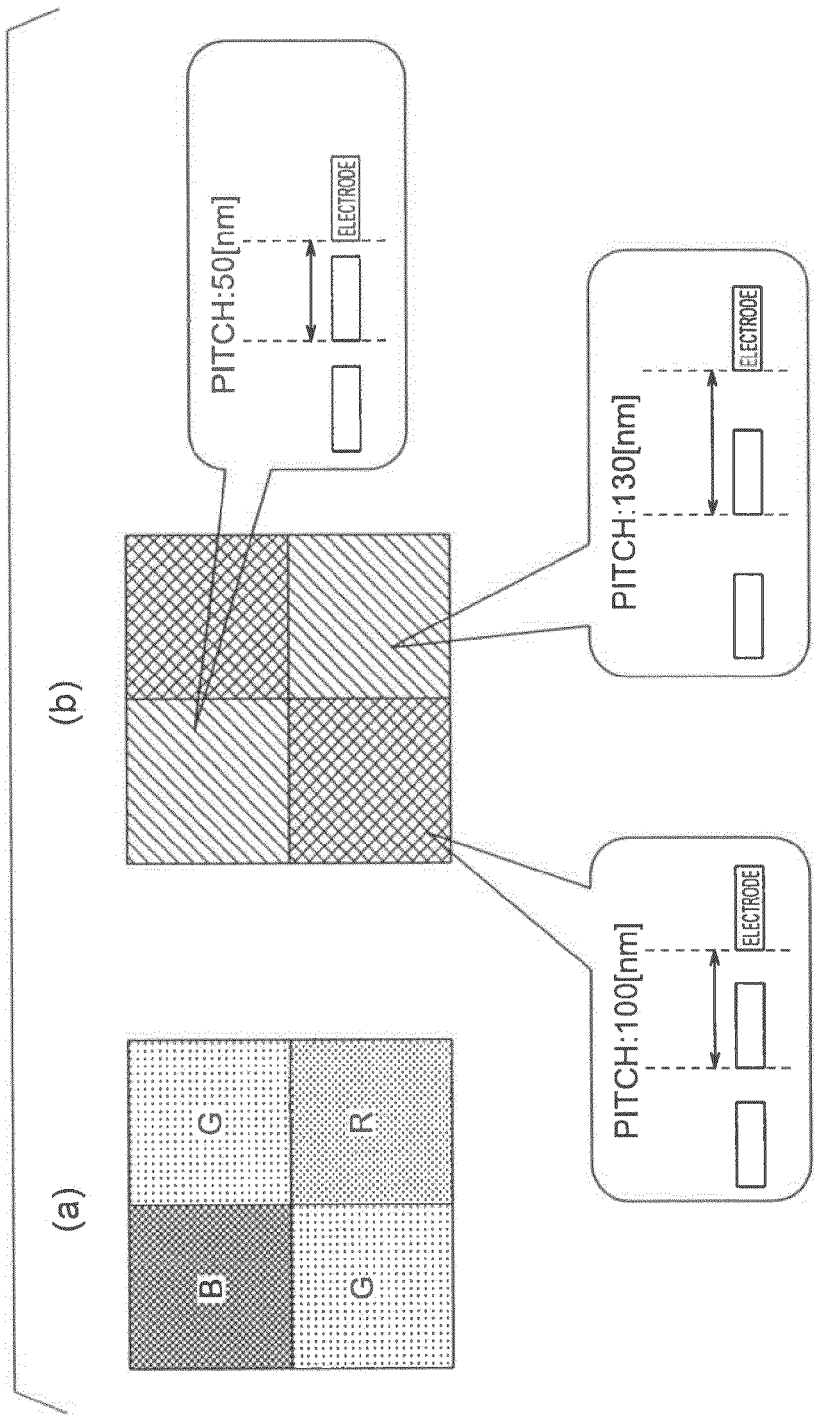
FIGS. 12(a) and 12(b) are diagrams for explaining that the pitch of the ultrafine metal structures in the pixel unit in a single panel color element varies among colors.

In a single panel color element, on the other hand, ultrafine metal structures having an optimum material, an optimum pitch, and the likes for a desired light wavelength should be formed for each of the pixels corresponding to the three primary colors of RGB. For example, in a case where color filters are arranged in the Bayer pattern as shown in FIG. 12(*a*), and ultrafine metal structures are formed for all the pixels of R, G, and B as shown in FIG. 12(*b*) in a single panel color element, the ultrafine metal structures should be formed at the optimum pitch for each of the pixels of R, G, and B. If the R pixel has a desired resonant wavelength of 630 nm, the G pixel has a desired resonant wavelength of 550 nm, and the B pixel has a desired resonant wavelength of 450 nm as the center values of light wavelengths in this case, the pitch of the ultrafine metal structures made of Al is 130 nm, 100 nm, and 50 nm in the respective pixels of R, G, and B, as can be seen from FIG. 12(*b*).

Figure 13:
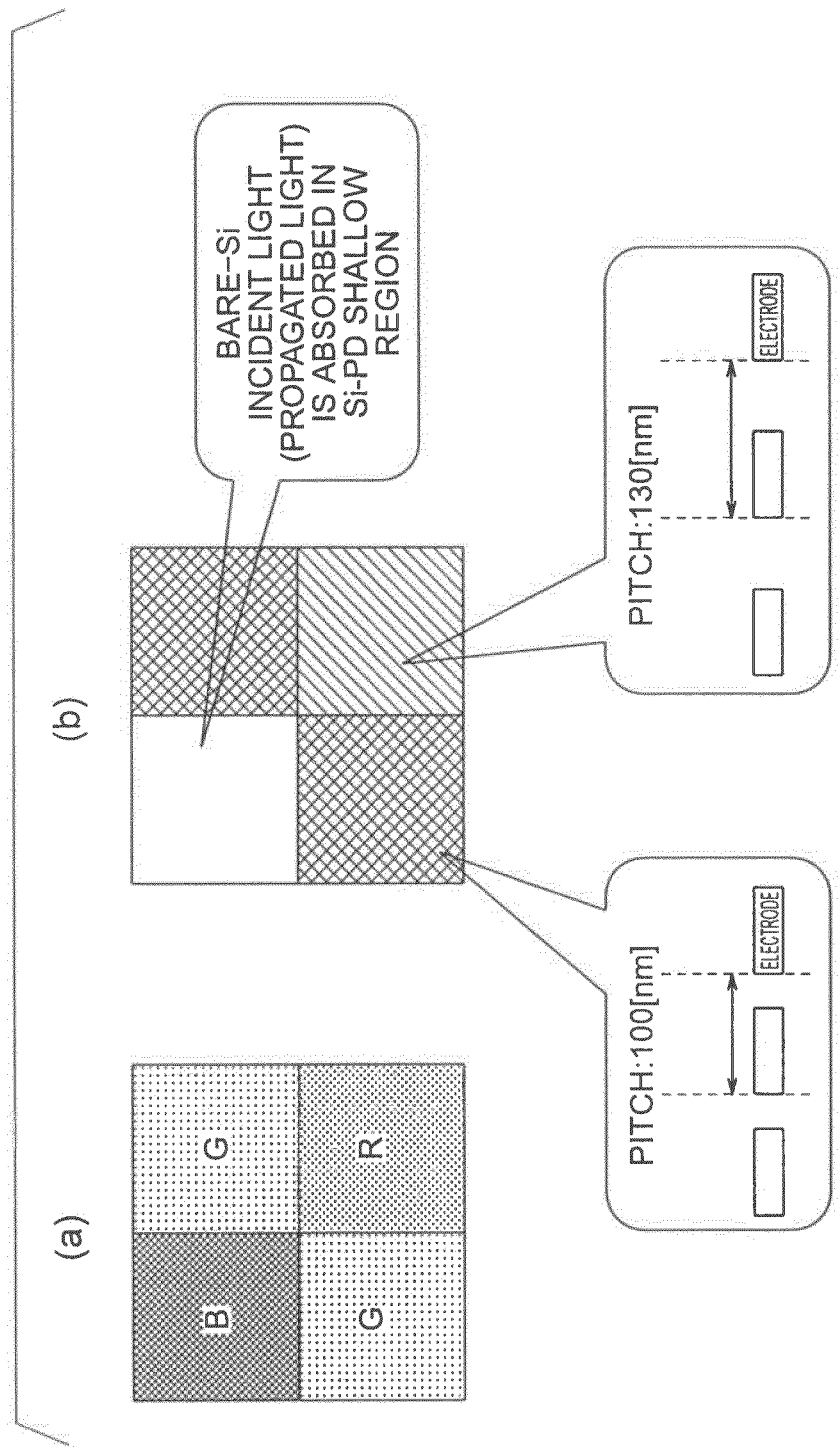
FIGS. 13(a) and 13(b) are diagrams for explaining a case where the ultrafine metal structures are not provided only in the pixel for detecting blue light in the pixel unit in a single panel color element.

Also, in a single panel color element, color filters may be arranged in the Bayer pattern as shown in FIG. 13(*a*), and ultrafine metal structures may be formed only for the pixels of R and G as shown in FIG. 13(*b*). In this case, the ultrafine metal structures should be formed at the optimum pitch for each of the pixels of R and G. If the R pixel has a desired resonant wavelength of 630 nm, and the G pixel has a desired resonant wavelength of 550 nm as the center values of light wavelengths in this case, the pitch of the ultrafine metal structures made of Al is 130 nm and 100 nm in the respective pixels of R and G, as can be seen from FIG. 13(*b*). Since the ultrafine metal structures are not formed for the B pixel in this case, plasmon resonance does not occur. However, blue light has short wavelengths, and the absorption coefficient of single-crystal silicon is high. Accordingly, most of blue light is absorbed in the vicinities of the surfaces of photodiodes. Therefore, the sensitivity to blue light does not become lower, even if the ultrafine metal structures are not formed for the B pixel.

Figure 14:
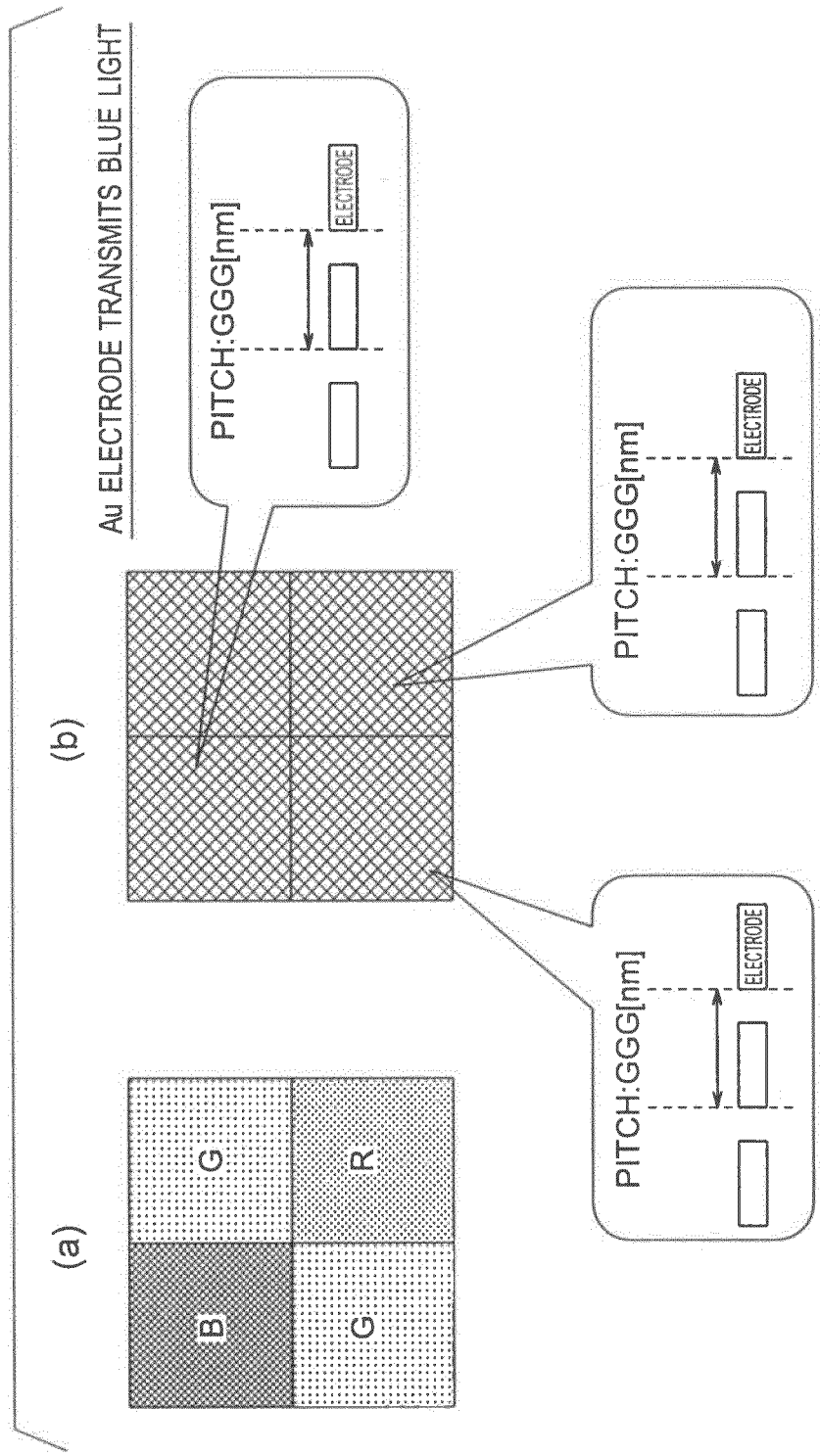
FIGS. 14(a) and 14(b) are diagrams for explaining that the pitch of the ultrafine metal structures in the pixel unit in a single panel color element varies among colors.

Also, in a single-panel color element, color filters may be arranged in the Bayer pattern as shown in FIG. 14(*a*), and ultrafine metal structures made of Au (gold) are formed for all the pixels of G, and B, as shown in FIG. 14(*b*). In that case, the ultrafine metal structures should be formed at the same pitch for the respective pixels of R, G, and B. Since Au is selected as the material of the ultrafine metal structures, resonance with blue light does not occur, and nonresonant propagated light is absorbed as it is by photodiodes. However, blue light has short wavelengths, and the absorption coefficient of single-crystal silicon is high. Accordingly, most of blue light is absorbed in the vicinities of the surfaces of the photodiodes, and does not cause any problem. Further, since the ultrafine metal structures made of Au have a broad resonant spectrum, the specifications (the pitch, thickness, and the likes) of the ultrafine metal structures for the G and R pixels may be the same. As there is no need to change the pitch among the pixels, the manufacture can be performed through lower-cost manufacturing procedures such as self-assembly, instead of higher-cost photolithography procedures.

In the case where the ultrafine metal structures are formed at the same pitch for all the pixels of R, G, and B, as shown in FIGS. 14(a) and 14(b), blue light travels through the ultrafine metal structures, and red light and green light resonate in the same manner even if the ultrafine metal structures are formed at the same pitch. Those aspects are described in the following.

Figure 15:
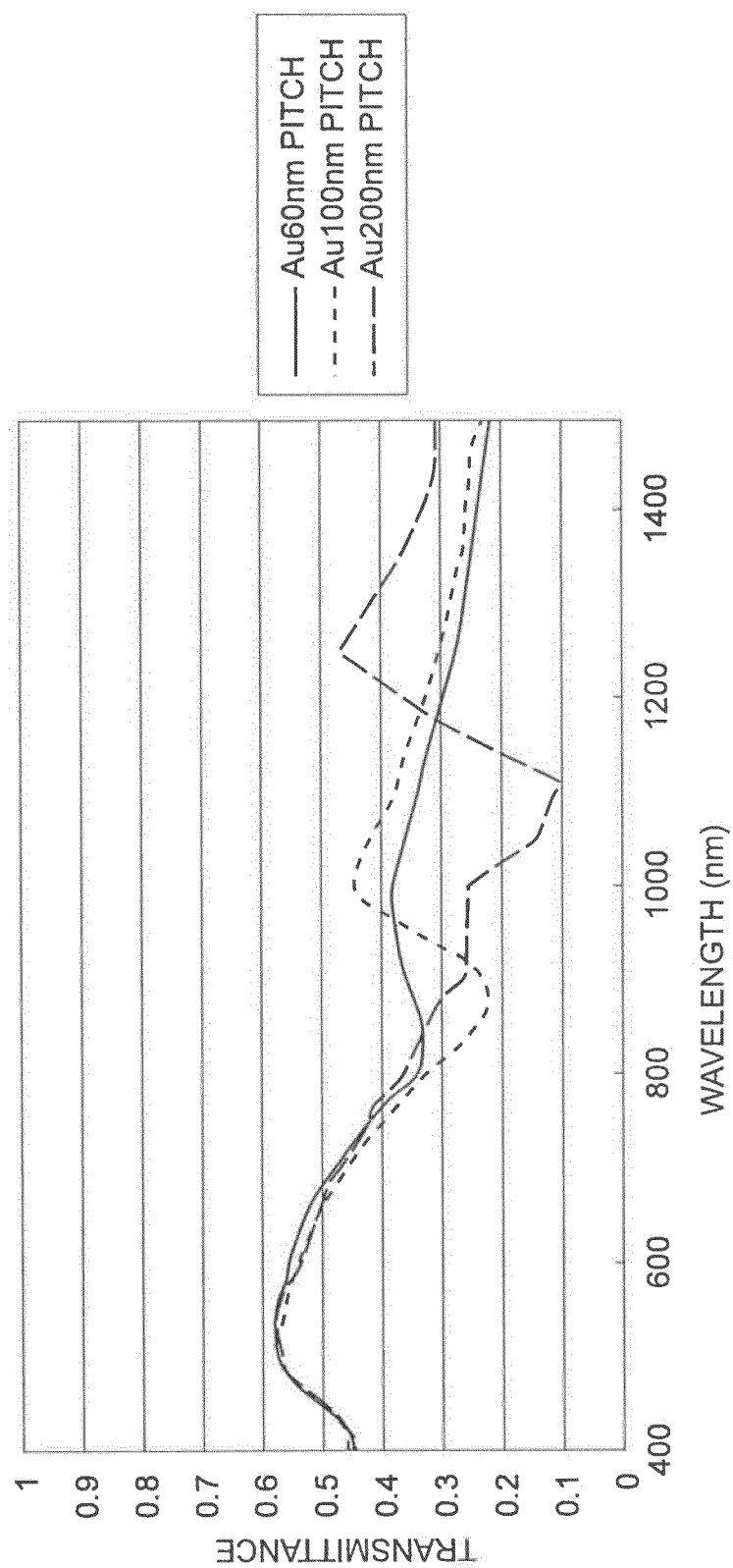
FIG. 15 shows the transmittance spectra of ultrafine metal structures made of Au.

FIG. 15 shows the wavelength dependencies (transmittance spectra) with respect to the transmittance of ultrafine metal structures in a case where the ultrafine metal structures are made of Au (gold), and the pitch of the ultrafine metal structures is varied from 200 nm to 100 nm to 60 nm. The electrode gap opening width of the ultrafine metal structures is half the pitch, and the thickness of each of the ultrafine metal structures is 20 nm. The ultrafine metal structures are arranged in a square lattice fashion. As can be seen from FIG. 15, the transmittance spectra exhibit substantially the same characteristics in the visible region (the region of 400 to 700 nm in wavelength). In the neighborhood of blue light, the transmittance spectra do not vary, and the transmittance is high.

In the first embodiment and the later described second through fourth embodiments, the ultrafine metal structures are arranged at intervals in the imaging region 101. However, the thickness of each of the ultrafine metal structures is preferably in the range of 10 to 200 nm. Also, the pitch and size of the ultrafine metal structures are preferably selected in accordance with the wavelength of each color to be transmitted.

In the later described second through fourth embodiments as well as the first embodiment, surface plasmon resonance caused by forming ultrafine metal structures for the pixels in the imaging region is utilized. Accordingly, crosstalk noise can be remarkably reduced, while low dark current properties of the photodiodes are maintained. Thus, a high-sensitivity solid-state imaging device with a high S/N ratio can be obtained.

Figure 16:
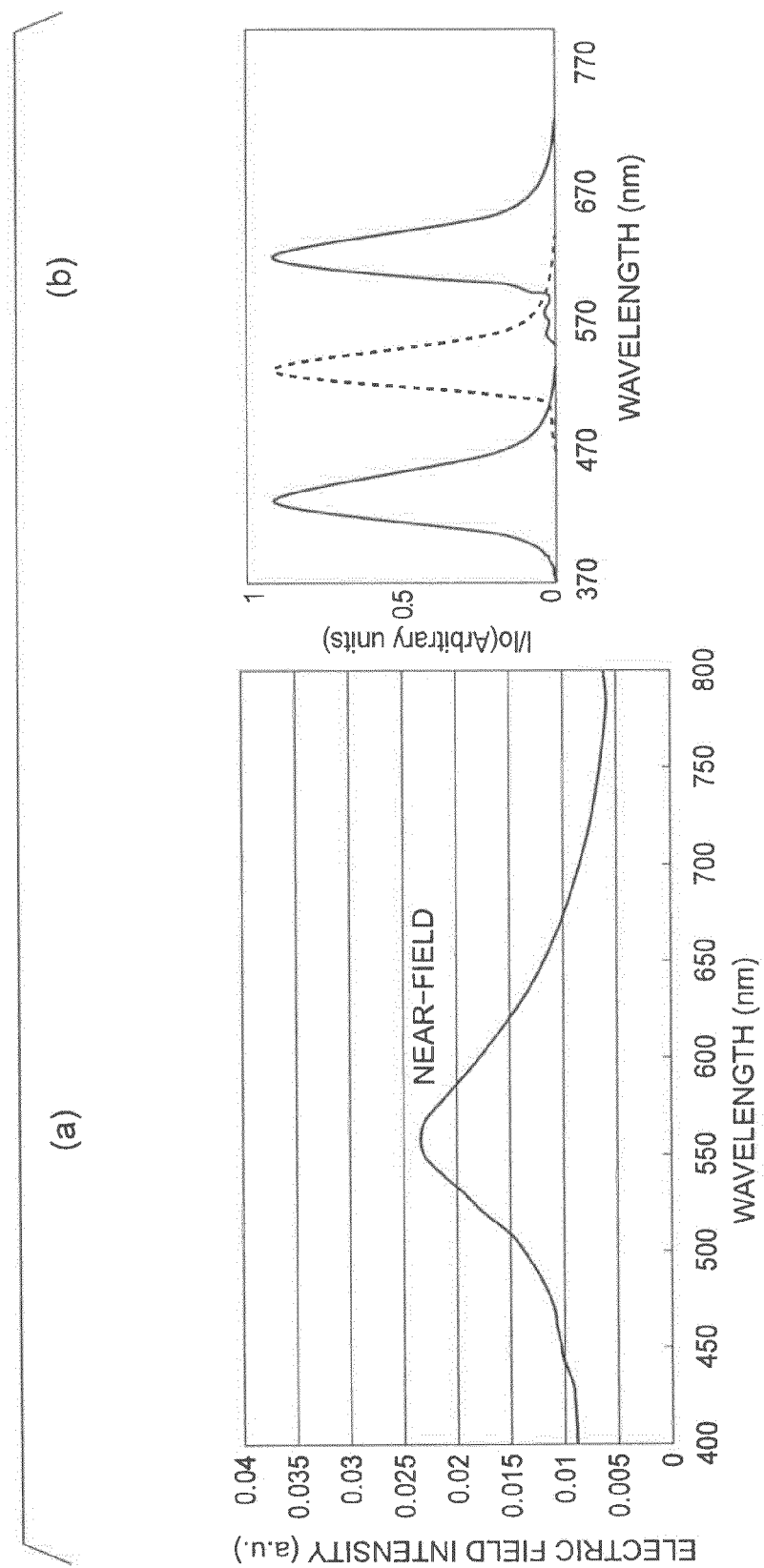
FIGS. 16(a) and 16(b) show near-field and far-field spectra.

On the other hand, JP-A 2009-38352 (KOKAI) discloses that a minute two-dimensional pattern structure is formed on a semiconductor that forms a photoelectric conversion region, and that plasmon resonance is utilized. This publication also discloses that the color filer array of single panel color elements can be removed by utilizing the plasmon resonance. However, the spectrum of the electric fields (near-fields) localized by surface plasmon resonance is broad as shown in FIG. 16(a). As a result, desired color separations cannot be performed, and crosstalk occurs. More specifically, mixed-color components and noise increase, and the sensitivity becomes lower. As shown in FIG. 16(b), a far-field spectrum transmits particular wavelengths. However, the half-value width is small, and a distance of several microns from the ultrafine metal structures is required to obtain a far-field spectrum literally. Therefore, the effect to reduce crosstalk by shortening the invasion length of obliquely incident light cannot be achieved.

Figure 17:
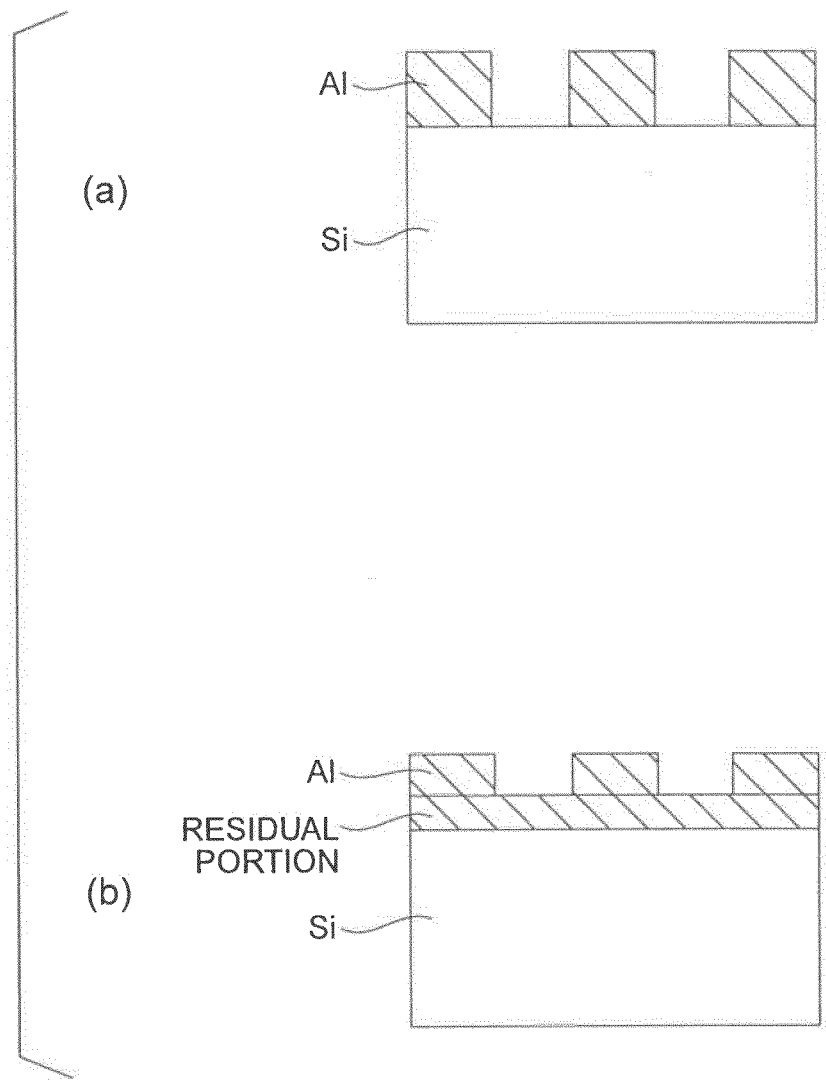
FIGS. 17(a) and 17(b) are cross-sectional views for explaining a case where a residual portion does not exist in the ultrafine metal structures and a case where a residual portion exists in the ultrafine metal structures.
Figure 18:
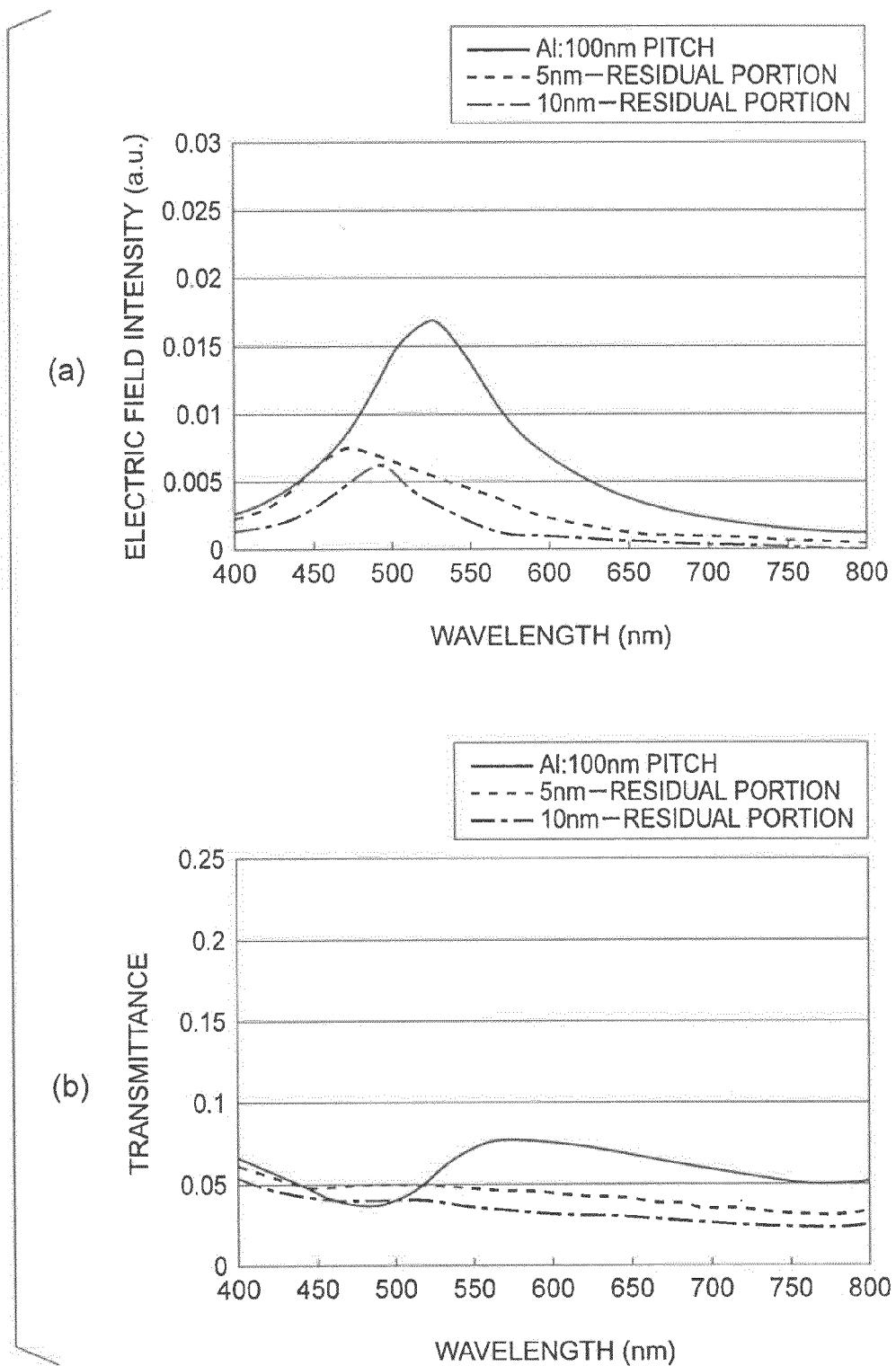
FIG. 18(a) shows the near-field spectra observed in a case where a residual portion does not exist in the ultrafine metal structures and in cases where a residual portion exists in the ultrafine metal structures.
FIG. 18(b) shows the transmittance spectra observed in a case where a residual portion does not exist in the ultrafine metal structures and in cases where a residual portion exists in the ultrafine metal structures.

Also, when ultrafine metal structures are formed, it is preferable to leave no metal materials between the ultrafine metal structures. If a metal material remains (if a residual portion exists), the electric field intensity and the transmittance are adversely affected. FIGS. 18(a) and 18(b) show the electric field strengths and transmittance spectra observed in a case where silicon is exposed through each bottom portion between ultrafine metal structures made of Al as shown in FIG. 17(a), and in a case where there is an Al residual portion existing at the bottom portions between ultrafine metal structures made of Al as shown in FIG. 17(b), for example. In either case, the pitch of the ultrafine metal structures made of Al is 100 nm, and the diameter is 50 nm. Although the thickness of the ultrafine metal structures is 30 nm, the total of the thickness of the ultrafine metal structures and the thickness of the residual portion is 30 nm in the case where the Al residual portion exists. In the case where an Al residual portion exists, the spectra observed in cases where the thickness of the Al residual portion is 5 nm and 10 nm are shown. As can be seen from FIG. 18(a), in the case where a residual portion does not exist, the electric field intensity is higher than that in the cases where a residual portion exists. Also, the transmittance is higher, except for the region of 450 to 520 nm in wavelength.

As described above, according to this embodiment, a high S/N ratio can be achieved, despite miniaturization.

Second Embodiment

Figure 19:
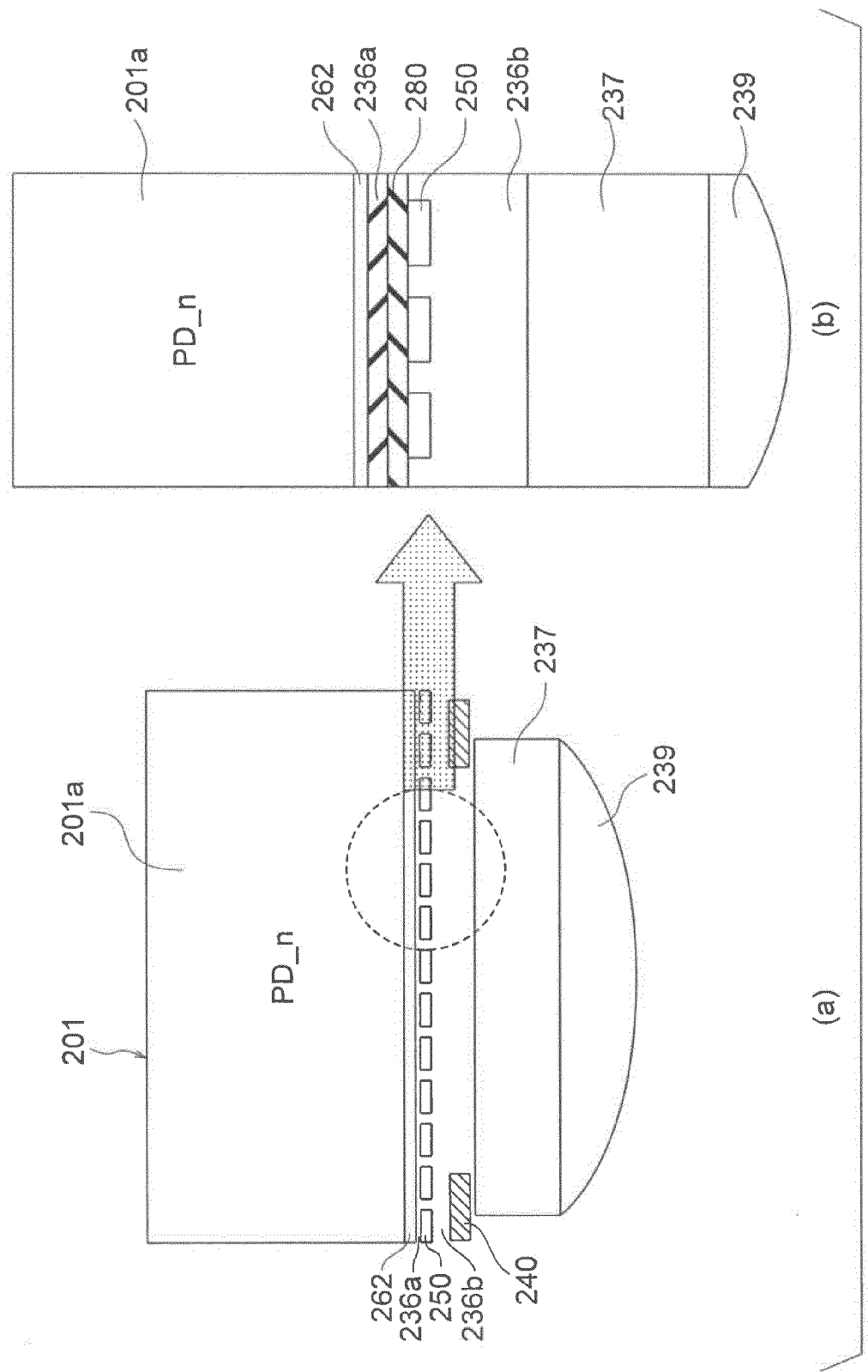
FIGS. 19(a) and 19(b) are cross-sectional views of a solid-state imaging device according to a second embodiment.

Referring now to FIGS. 19(a) and 19(b), a solid-state imaging device according to a second embodiment is described. FIG. 19(a) is a cross-sectional view of the solid-state imaging device according to the second embodiment, and FIG. 19(b) is an enlarged cross-sectional view of the portion surrounded by the broken line in FIG. 19(a). The solid-state imaging device of the second embodiment is the same as the solid-state imaging device of the first embodiment illustrated in FIG. 3, except that a fixed charge layer 280 that retains fixed charges is provided between the ultrafine metal structures 250 and the insulating layer 236a. Since the signal charges are electrons in this embodiment, negative charges are retained in the fixed charge layer 280, so as to induce holes in the vicinity of the interface between the $SiO_2$ layer and the silicon semiconductor substrate. With this arrangement, a hole storage region 262 is formed in the region of each PD_n-region 201a facing the fixed charge layer 280. Therefore, unlike the first embodiment, the second embodiment can maintain low dark current properties of photodiodes, without biasing with a negative voltage being performed on the ultrafine metal structures 250.

As the fixed charge layer 280, it is preferable to use an oxide dielectric layer containing at least one element selected from the group consisting of hafnium (Hf), zirconium (Zr), and titanium (Ti), for example. In a case where a hafnium oxide is used, for example, layer formation can be performed by ALD (Atomic Layer Deposition) using TDEAH (Tetrakis-DiEthylAmido-Hafnium) as a raw material. Specifically, after a hafnium oxide layer is formed by ALD, annealing is performed in a hydrochloric acid atmosphere, to terminate the dangling bonds of hafnium atoms existing in the interface between the hafnium oxide and the silicon oxide with chlorine atoms. In this manner, negative fixed charges can be formed and retained.

Figure 20:
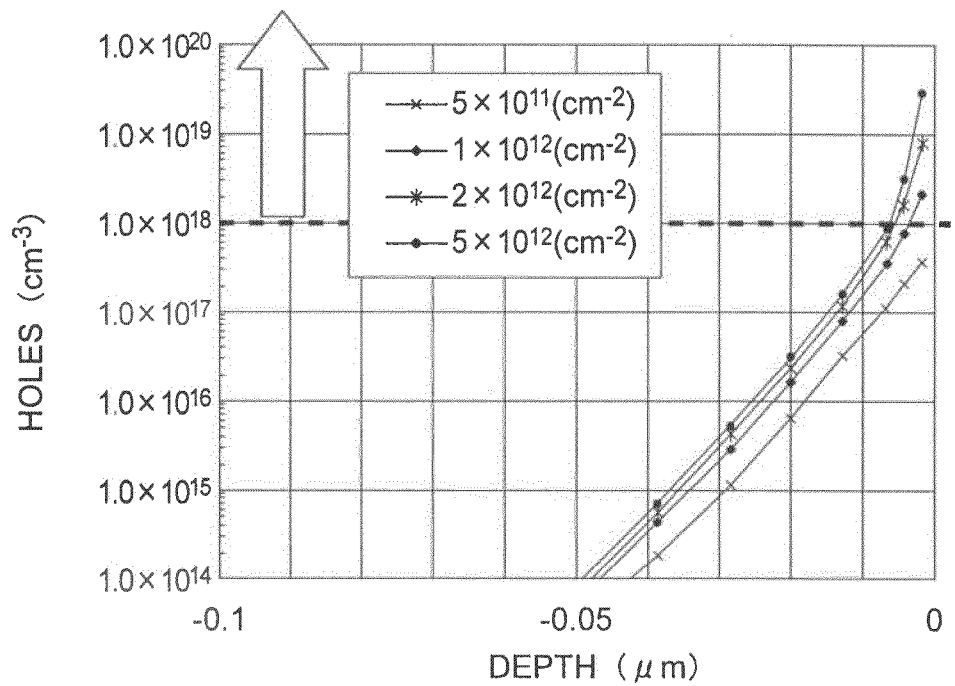
FIG. 20 shows the depth dependencies with respect to the density of holes induced in a hole induced layer by a fixed charge layer.
Figure 21:
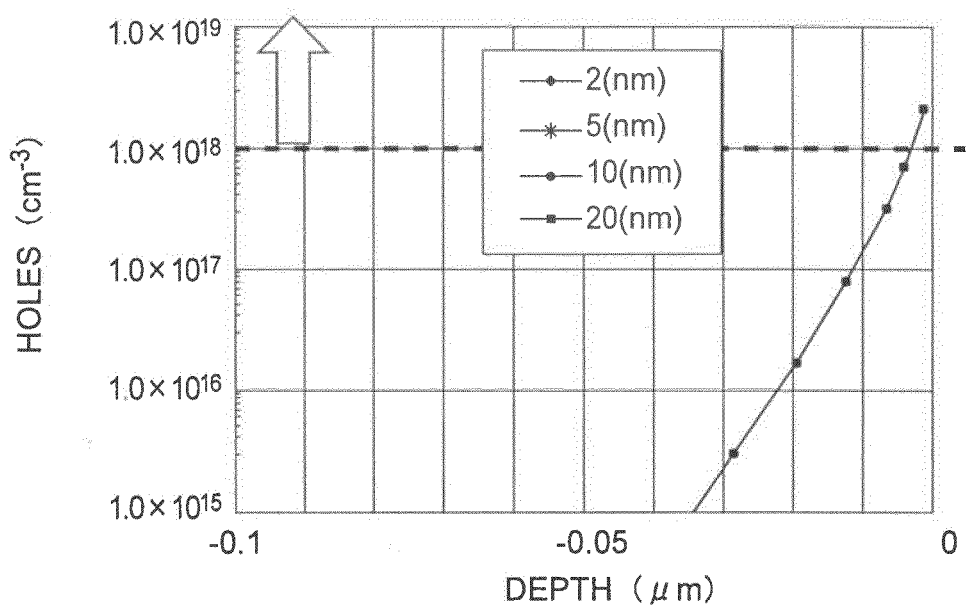
FIG. 21 shows the depth dependencies with respect to the density of holes induced in the hole induced layer by the fixed charge layer.

To realize low dark current properties, the volume density of the holes in the hole storage region 262 should be adjusted to $1 \times 10^{18}$ $cm^{-3}$ or higher. FIGS. 20 and 21 show the results of simulations performed with respect to the layer thickness of the $SiO_2$ layer and the fixed charge density to realize the low dark current properties.

FIG. 20 is a graph showing the relationship between the density ($cm^{-3}$) of holes induced in each PD_n-region 201a in the vicinity of the interface with the $SiO_2$ layer 236a and the depth from the interface with the $SiO_2$ layer 236a observed in a case where the layer thickness of the $SiO_2$ layer 236a between the ultrafine metal structures 250 and each PD_n-region 201a is 2 nm, and the area density of the fixed charges in the fixed charge layer 280 is varied from $5 \times 10^{11}$ $cm^{-2}$ to $1 \times 10^{12}$ $cm^{-2}$ to $2 \times 10^{12}$ $cm^{-2}$ to $5 \times 10^{12}$ $cm^{-2}$. As can be seen from FIG. 20, where the layer thickness of the $SiO_2$ layer 236a between the ultrafine metal structures 250 and each PD_n-region 201a is 2 nm, the area density of the fixed charges in the fixed charge layer 262 is preferably $2\times10^{12}$ cm$^{-2}$ or higher.

FIG. 21 is a graph showing the relationship between the density (cm$^{-3}$) of holes induced in each PD_n-region 201a in the vicinity of the interface with the SiO$_2$ layer 236a and the depth from the interface with the SiO$_2$ layer layer 236a observed in a case where the area density of the fixed charges in the fixed charge layer 280 is $1\times10^{12}$ cm$^{-2}$, and the layer thickness of the SiO$_2$ layer 236a between the ultrafine metal structures 250 and each PD_n-region 201a is varied from 2 nm to 5 nm to 10 nm to 20 nm. As can be seen from FIG. 21, where the layer thickness of the SiO$_2$ layer 236a is 2 nm, 5 nm, 10 nm, or 20 nm, the same characteristics are observed.

As can be seen from FIGS. 20 and 21, by adjusting the area density in the fixed charge layer 280 to $1\times10^{12}$ cm$^{-2}$ or higher, a sufficient hole storage layer 262 is formed in the vicinity of the interface, and dark current is reduced. Also, by adjusting the area density of fixed charges to $1\times10^{13}$ cm$^{-2}$ or higher, the effect to reduce dark current can be achieved in a more stable manner, which is more preferable.

Like the first embodiment, this embodiment can remarkably reduce crosstalk noise, while maintaining low dark current properties of photodiodes. Further, the effects to improve the sensitivity to blue light and the sensitivity to red light are achieved. Accordingly, a high-sensitivity solid-state imaging device with a high S/N ratio can be realized.

Furthermore, high-sensitivity characteristics can be realized even if the PD_n-regions are made shallower. In conventional cases, miniaturization in the depth direction of the substrate cannot be performed to maintain light absorption properties, and the scaling in pixel miniaturization is anisotropic. In this embodiment, on the other hand, isotropic scaling can be performed. Accordingly, there is less need to form deep PD_n-regions or perform deep device separations as specifically required in designing and processing of solid-state imaging devices. Thus, it is possible to remarkably reduce the difficulties in device development. Also, the device development period can be shortened, and the device development costs can be lowered. Also, a high S/N ratio can be achieved, though miniaturization is performed. Unlike the first embodiment, this embodiment does not require application of a bias voltage to the ultrafine metal structures. Accordingly, the device structure can be simplified, and the effect to reduce the device area and the likes can also be achieved.

Third Embodiment

Figure 22:
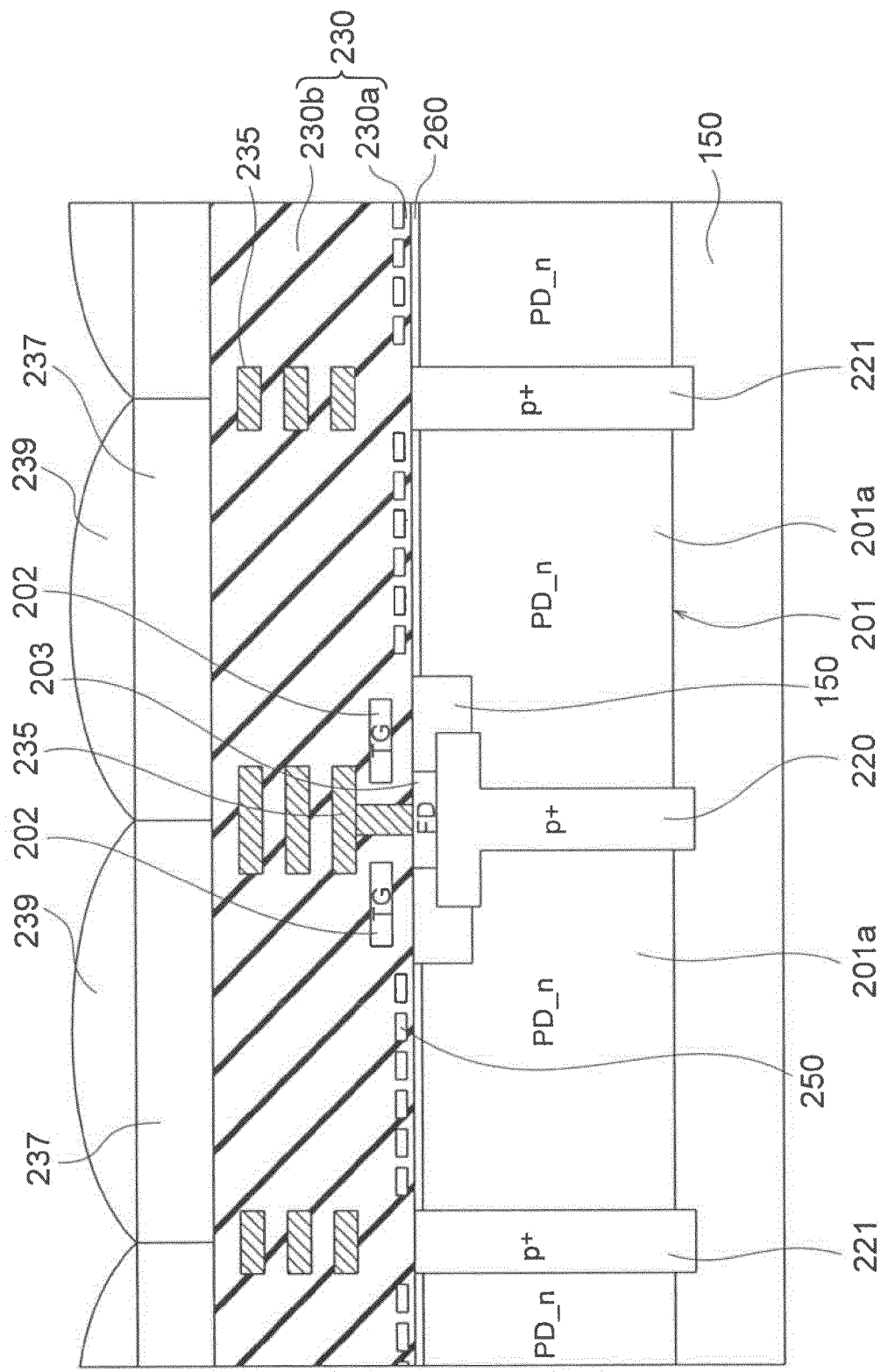
FIG. 22 is a cross-sectional view of a solid-state imaging device according to a third embodiment.

FIG. 22 is a cross-sectional view of a solid-state imaging device according to a third embodiment. The solid-state imaging device of the third embodiment is a solid-state imaging device of a front-illuminated type. PD_n-regions 201a forming photodiodes 201 are formed inside a p-type silicon substrate 150. The signal electrons generated through photoelectric conversions in the photodiodes 201 having pn junctions formed with the PD_n-regions 201a and the p-type semiconductor substrate 150 are stored into the PD_n-regions 201a. Transfer transistors 202 formed in the silicon substrate 150 are turned on, to transfer the signal electrons to each floating diffusion layer 203. The amplifier transistor 205 (see FIG. 2) having its gate electrically connected to the floating diffusion layer 203 is modulated to read signals in accordance with the amount of incident light. The transistor transistors 202 and the amplifier transistor 205 are covered with an interlayer insulating layer 230. Metal wirings 235 connected to those transistors or the floating diffusion layers 203 are provided in the interlayer insulating layer 230. Color filters 237 are provided on the interlayer insulating layer 230, and microlenses 239 are provided on the color filters 237. The interlayer insulating layer 230 includes an insulating layer 230a and an insulating layer 230b. In this embodiment, the ultrafine metal structures 250 described in the first and second embodiments are formed on the insulating layer 230a, and the insulating layer 230b is formed to cover the ultrafine metal structures 250. As described in the first and second embodiments, the ultrafine metal structures 250 each have a nanometer size, and are arranged at intervals in a mesh-like fashion. Further, biasing is performed with a negative voltage of −2 to −10 V, for example, as in the first embodiment. Accordingly, a hole induced region 260 is formed on the surface of each PD_n-region 201a facing the ultrafine metal structures 250, as in the first embodiment. As the hole induced region 260 is formed, dark current is prevented from flowing into the PD_n-regions 201a, as in the first embodiment.

Each PD_n-region 201a is a so-called buried photodiode structure that is completely buried inside the silicon substrate 150 to lower noise, and high-density p$^+$-type impurity diffused regions 220 and 221 are provided as the pixel separation structures for separating devices from adjacent pixels. Each p$^+$-type impurity diffused region 220 is provided to extend from the lower face of the corresponding floating diffusion layer 203 to the p-type silicon substrate 150 through the lower face of the corresponding PD_n-region 201a. Each p$^+$-type impurity diffused region 221 is provided to extend from the surface of the p-type silicon substrate 150 to the inside of the p-type silicon substrate 150 through the lower face of the corresponding PD_n-region 201a.

Since there are adjacent pixels that share the floating diffusion layers 203 in this embodiment, a pixel-circuit sharing method can be implemented. Specifically, in the pixel layout of the solid-state imaging device according to this embodiment, the two photodiodes sharing one floating diffusion layer 203 are formed by arranging a photodiode 201, a transfer transistor 202, a floating diffusion layer 203, a transfer transistor 202, and a photodiode 201 in this order on the surface of the silicon substrate 150 on the wiring side. Inside the silicon substrate 150, however, a photodiode 201, a p$^+$-pixel separation region 220, and a photodiode 201 are formed and arranged in this order.

Like the first embodiment, this embodiment can remarkably reduce crosstalk noise, while maintaining low dark current properties of photodiodes. Further, the effects to improve the sensitivity to blue light and the sensitivity to red light are also achieved. Accordingly, a high-sensitivity solid-state imaging device with a high S/N ratio can be realized.

Furthermore, high-sensitivity characteristics can be realized even if the PD_n-regions are made shallower. In conventional cases, miniaturization in the depth direction of the substrate cannot be performed to maintain light absorption properties, and the scaling in pixel miniaturization is anisotropic. In this embodiment, on the other hand, isotropic scaling can be performed. Accordingly, there is less need to form deep PD_n-regions or perform deep device separations as specifically required in designing and processing of solid-state imaging devices. Thus, it is possible to remarkably reduce the difficulties in device development. Also, the device development period can be shortened, and the device development costs can be lowered. Also, a high S/N ratio can be achieved, though miniaturization is performed.

Fourth Embodiment

Figure 23:
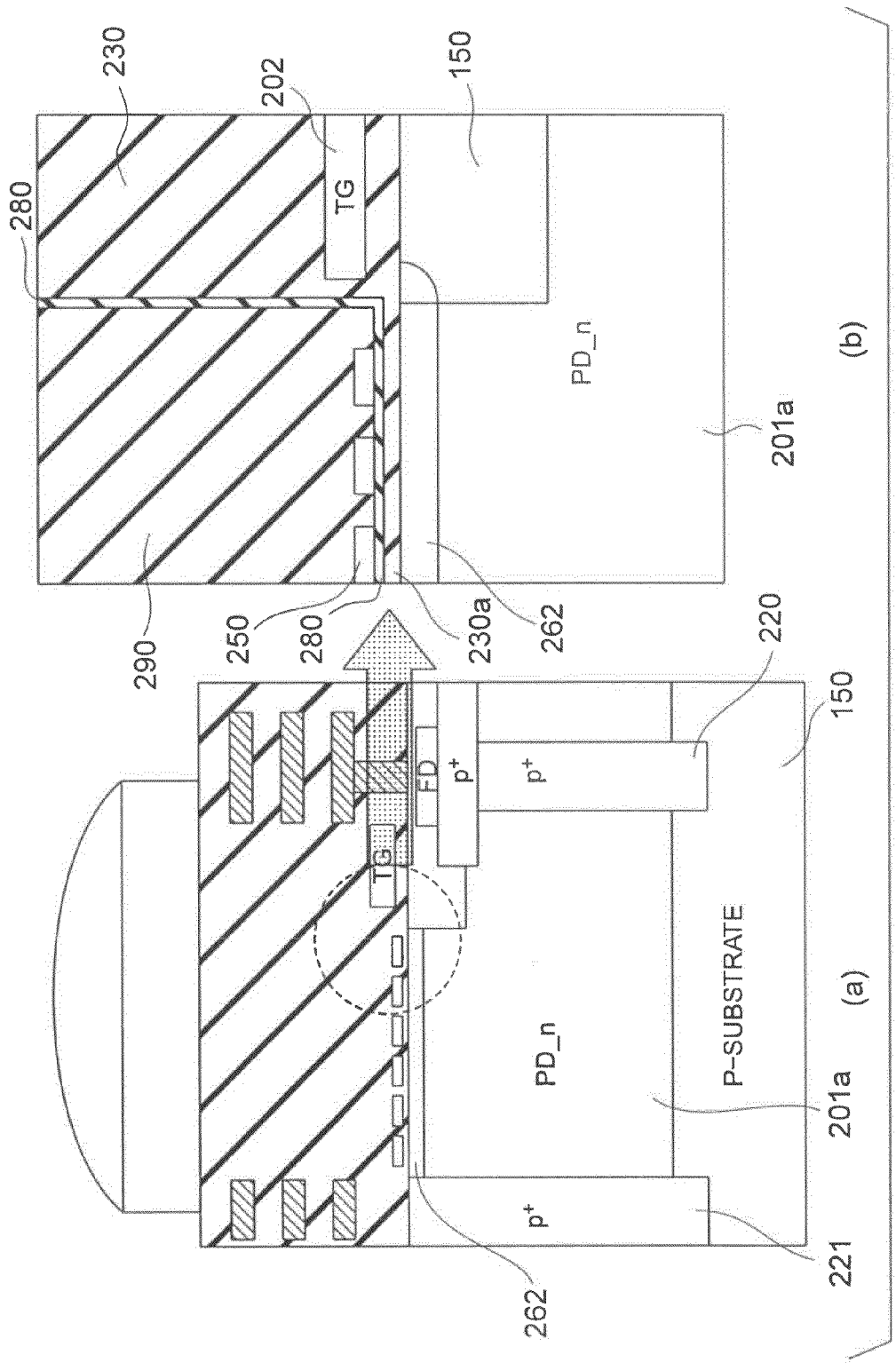
FIGS. 23(a) and 23(b) are cross-sectional views of a solid-state imaging device according to a fourth embodiment.

Referring now to FIGS. 23(a) and 23(b), a solid-state imaging device according to a fourth embodiment is described.

FIG. 23(a) is a cross-sectional view of the solid-state imaging device according to the fourth embodiment, and FIG. 23(b) is an enlarged cross-sectional view of the portion surrounded by the broken line in FIG. 23(a). The solid-state imaging device of the fourth embodiment is the same as the solid-state imaging device of the third embodiment illustrated in FIG. 22, except that a fixed charge layer 280 that retains fixed charges is provided between the ultrafine metal structures 250 and the insulating layer 236a. Since the signal charges are electrons in this embodiment, negative charges are retained in the fixed charge layer 280. With this arrangement, a hole storage region 262 is formed in the region of each PD_n-region 201a facing the fixed charge layer 280. Therefore, as in the second embodiment, low dark current properties of photodiodes can be maintained in the fourth embodiment, without biasing with a negative voltage being performed on the ultrafine metal structures 250. In this embodiment, the insulating layer 236a is preferably an extremely thin silicon oxide layer of approximately several atomic layers, for example.

In this embodiment, the fixed charge layer 280 is formed on each PD_n-region 201a via a thin insulating layer 230a. In each boundary region between a PD_n-region 201a and the p-type silicon substrate 150, the fixed charge layer 280 is formed to extend from the upper face of the p-type silicon substrate 150 toward the upper face of an interlayer insulating layer 230. With this arrangement, the ultrafine metal structures 250 on each PD_n-region 201a are covered with a buried insulating layer 290. As in the second embodiment, in this embodiment, the insulating layer 236a is preferably an extremely thin silicon oxide layer of approximately several atomic layers, for example.

As in the second embodiment, as the fixed charge layer 280, it is preferable to use an oxide dielectric layer containing at least one element selected from the group consisting of hafnium (Hf), zirconium (Zr), and titanium (Ti), for example. In a case where a hafnium oxide is used, for example, layer formation can be performed by ALD (Atomic Layer Deposition) using TDEAH (Tetrakis-DiEthylAmido-Hafnium) as a raw material. Specifically, after a hafnium oxide layer is formed by ALD, annealing is performed in a hydrochloric acid atmosphere, to terminate the dangling bonds of hafnium atoms existing in the interface between the hafnium oxide and the silicon oxide with chlorine atoms. In this manner, negative fixed charges can be formed and retained.

To realize low dark current properties, the volume density of the holes in the hole storage region 262 should be adjusted to $1 \times 10^{18}$ cm$^{-3}$ or higher.

As in the second embodiment, by adjusting the area density in the fixed charge layer 280 to $1 \times 10^{12}$ cm$^{-2}$ or higher, a sufficient hole storage layer 262 is formed in the vicinity of the interface, and dark current is reduced in the fourth embodiment. Also, by adjusting the area density of fixed charges to $1 \times 10^{13}$ cm$^{-2}$ or higher, the effect to reduce dark current can be achieved in a more stable manner, which is more preferable.

Like the first embodiment, this embodiment can remarkably reduce crosstalk noise, while maintaining low dark current properties of photodiodes. Further, the effects to improve the sensitivity to blue light and the sensitivity to red light are achieved. Accordingly, a high-sensitivity solid-state imaging device with a high S/N ratio can be realized.

Furthermore, high-sensitivity characteristics can be realized even if the PD_n-regions are made shallower. In conventional cases, miniaturization in the depth direction of the substrate cannot be performed to maintain light absorption properties, and the scaling in pixel miniaturization is anisotropic. In this embodiment, on the other hand, isotropic scaling can be performed. Accordingly, there is less need to form deep PD_n-regions or perform deep device separations as specifically required in designing and processing of solid-state imaging devices. Thus, it is possible to remarkably reduce the difficulties in device development. Also, the device development period can be shortened, and the device development costs can be lowered. Also, a high S/N ratio can be achieved, though miniaturization is performed. Unlike the third embodiment, this embodiment does not require application of a bias voltage to the ultrafine metal structures. Accordingly, the device structure can be simplified, and the effect to reduce the device area and the likes can also be achieved.

Although electrons are stored and read out as photogenerated carriers in the above description, the above embodiments may also be applied to cases where holes are read out as photogenerated carriers. In that case, the semiconductor substrate and the impurity diffused regions are of the opposite conductivity type of the above, and the polarity of the bias voltage to be applied to the ultrafine metal structures and the polarity of fixed charges are reversed. By doing so, the same effects as above can be achieved.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A solid-state imaging device comprising:
   a semiconductor substrate of a first conductivity type having a first face and a second face that is the opposite side from the first face;
   a plurality of pixels provided on the first face of the semiconductor substrate, each of the pixels including a semiconductor region of a second conductivity type that converts incident light into signal charges, and stores the signal charges;
   a readout circuit provided on the second face of the semiconductor substrate to read the signal charges stored in the pixels;
   an ultrafine metal structure placed at intervals on a face on a side of the semiconductor region, the light being incident on the face, and said ultrafine metal structure exhibiting surface plasmon resonance in which electric field is emitted upon irradiation with incident light;
   at least one insulating layer provided between the ultrafine metal structure and the semiconductor region, said at least one insulating layer having a thickness selected so that said electric field emitted by said ultrafine metal structure due to surface plasmon resonance extends through said at least one insulating layer and into said semiconductor region;
   a fixed charge layer provided between the ultrafine metal structure and the insulating layer, and retains negative fixed charges; and
   a hole storage region provided on a side of a face of the semiconductor region and stores holes, the face facing the fixed charge layer.

2. The device according to claim 1, wherein
   the semiconductor substrate is a silicon substrate,
   the insulating layer is a silicon oxide layer, and the fixed charge layer is an oxide dielectric layer containing at least one of hafnium (Hf), zirconium (Zr), and titanium (Ti).

3. The device according to claim 1, wherein an area density of fixed charges in the insulating layer is $1 \times 10^{12}$ (cm$^{-2}$) or higher.

4. A solid-state imaging device comprising:
a plurality of pixels provided on a semiconductor substrate of a first conductivity type, each of the pixels including a semiconductor region of a second conductivity type that converts incident light from a first face side of the semiconductor substrate into signal charges, and stores the signal charges;
a readout circuit provided on the first face side of the semiconductor substrate, and reads the signal charges stored in the pixels;
an ultrafine metal structure placed at intervals on a face on a side of the semiconductor region, the light being incident on the face and said ultrafine metal structure exhibiting surface plasmon resonance in which electric field is emitted upon irradiation with incident light; and
at least one insulating layer provided between the ultrafine metal structure and the semiconductor region, said at least one insulating layer having a thickness selected so that said electric field emitted by said ultrafine metal structure due to surface plasmon resonance extends through said at least one insulating layer and into said semiconductor region;
a fixed charge layer provided between the ultrafine metal structure and the insulating layer, and retains negative fixed charges; and
a hole storage region provided on a side of a face of the semiconductor region and stores holes, the face facing the fixed charge layer.

5. The device according to claim 4, wherein
the semiconductor substrate is a silicon substrate,
the insulating layer is a silicon oxide layer, and
the fixed charge layer is an oxide dielectric layer containing at least one of hafnium (Hf), zirconium (Zr), and titanium (Ti).

6. The device according to claim 4, wherein an area density of fixed charges in the insulating layer is $1 \times 10^{12}$ (cm$^{-2}$) or higher.

* * * * *